US011115001B2

(12) United States Patent
Urata

(10) Patent No.: US 11,115,001 B2
(45) Date of Patent: Sep. 7, 2021

(54) RECEIVING FILTER, MULTIPLEXER, AND COMMUNICATION APPARATUS

(71) Applicant: KYOCERA Corporation, Kyoto (JP)

(72) Inventor: Tomonori Urata, Kyotanabe (JP)

(73) Assignee: KYOCERA Corporation, Kyoto (JP)

( * ) Notice: Subject to any disclaimer, the term of this patent is extended or adjusted under 35 U.S.C. 154(b) by 78 days.

(21) Appl. No.: 16/317,256

(22) PCT Filed: Jul. 5, 2017

(86) PCT No.: PCT/JP2017/024638
§ 371 (c)(1),
(2) Date: Jan. 11, 2019

(87) PCT Pub. No.: WO2018/012367
PCT Pub. Date: Jan. 18, 2018

(65) Prior Publication Data
US 2019/0305756 A1    Oct. 3, 2019

(30) Foreign Application Priority Data
Jul. 13, 2016    (JP) .............................. JP2016-138513

(51) Int. Cl.
*H03H 9/64*    (2006.01)
*H01Q 1/50*    (2006.01)
(Continued)

(52) U.S. Cl.
CPC ............ *H03H 9/6489* (2013.01); *H01Q 1/50* (2013.01); *H03H 9/02559* (2013.01);
(Continued)

(58) Field of Classification Search
CPC ............ H03H 9/6489; H03H 9/02559; H03H 9/02834; H03H 9/145; H03H 9/14544; H03H 9/64; H03H 9/72; H01Q 1/50
(Continued)

(56) References Cited

U.S. PATENT DOCUMENTS

| | | | |
|---|---|---|---|
| 7,733,196 B2 | 6/2010 | Tsurunari et al. | |
| 2004/0155730 A1* | 8/2004 | Iwamoto | H03H 9/0085 333/193 |

(Continued)

FOREIGN PATENT DOCUMENTS

| | | |
|---|---|---|
| JP | H10-065481 A | 3/1998 |
| JP | 2003-249842 A | 9/2003 |

(Continued)

OTHER PUBLICATIONS

AMachine translation of Toshikazu (JP2015041909) which has been relied upon. (Year: 2015).*

(Continued)

*Primary Examiner* — Hafizur Rahman
(74) *Attorney, Agent, or Firm* — Procopio Cory Hargreaves and Savitch LLP

(57) ABSTRACT

A receiving filter includes a reception terminal which outputs reception signals from an antenna terminal, a second DMS filter configured by a longitudinally coupled double-mode type acoustic wave filter which is located in a signal path from the antenna terminal to the reception terminal, a fourth GND terminal given a reference potential, and a fourth GND wiring connected to the fourth GND terminal and to the second DMS filter. A reception terminal conductor configured by the reception terminal and the reception terminal wiring connected to the reception terminal and A fourth GND conductor configured by the fourth GND terminal and the fourth GND wiring are adjacent and are capacity-coupled with respect to each other.

24 Claims, 22 Drawing Sheets

(51) Int. Cl.
  *H03H 9/02* (2006.01)
  *H03H 9/145* (2006.01)
  *H03H 9/72* (2006.01)

(52) U.S. Cl.
  CPC ........ *H03H 9/02834* (2013.01); *H03H 9/145* (2013.01); *H03H 9/14544* (2013.01); *H03H 9/64* (2013.01); *H03H 9/72* (2013.01)

(58) Field of Classification Search
  USPC ........................................................ 333/133
  See application file for complete search history.

(56) References Cited

U.S. PATENT DOCUMENTS

| | | |
|---|---|---|
| 2010/0194488 A1 | 8/2010 | Yoshimoto |
| 2013/0038406 A1 | 2/2013 | Yamane et al. |
| 2013/0120084 A1 | 5/2013 | Bauer et al. |

FOREIGN PATENT DOCUMENTS

| | | |
|---|---|---|
| JP | 2010-178306 A | 8/2010 |
| JP | 2013-526808 A | 6/2013 |
| JP | 2015-041909 A | 3/2015 |
| WO | 2006/118039 A1 | 11/2006 |
| WO | 2011/136099 A1 | 11/2011 |

OTHER PUBLICATIONS

"DUPLEXERS—An Introductory Tutorial" by Jack Daniel Company, 2005 (Year: 2005).*

Qurvo app note on Multiplexer, "Simplifying and Accelerating the Deploymentof Carrier Aggregation", Mar. 11, 2016 (Year: 2016).*

Bar et. al., Full-Duplex Receiver And PA Integration With BAW Devices, 2008 IEEE Topical Meeting on Silicon Monolithic Integrated Circuits in RF Systems. (Year: 2008).*

* cited by examiner

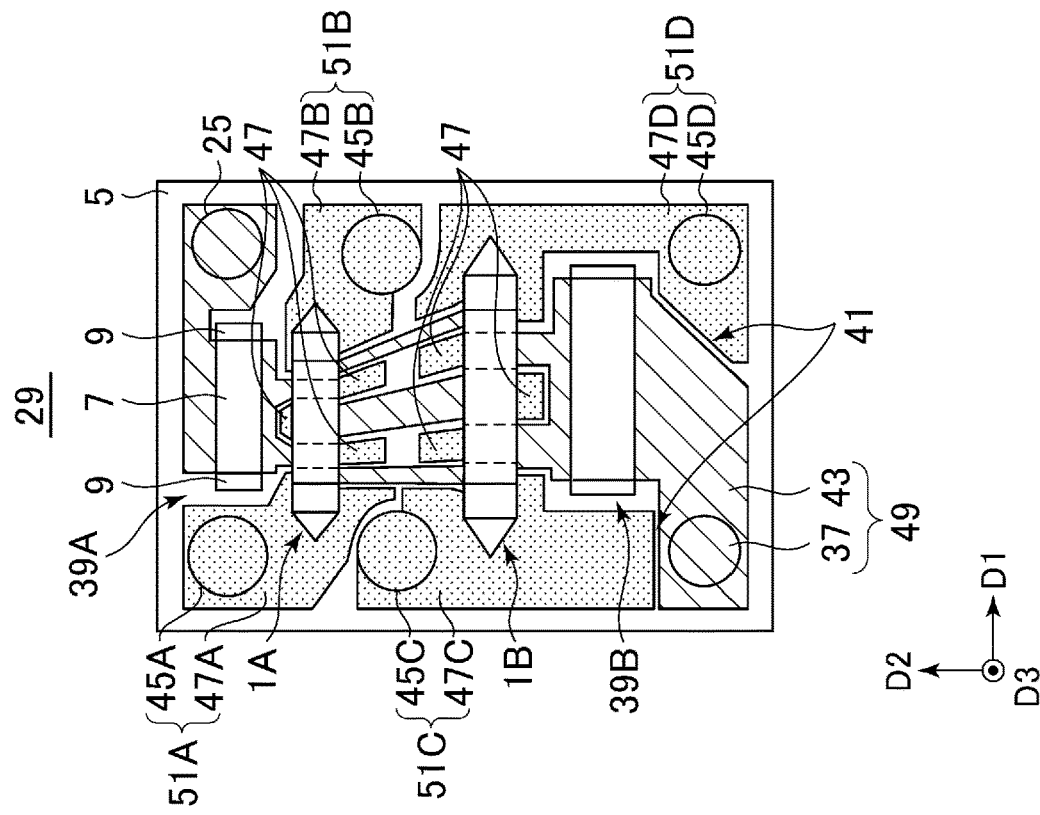
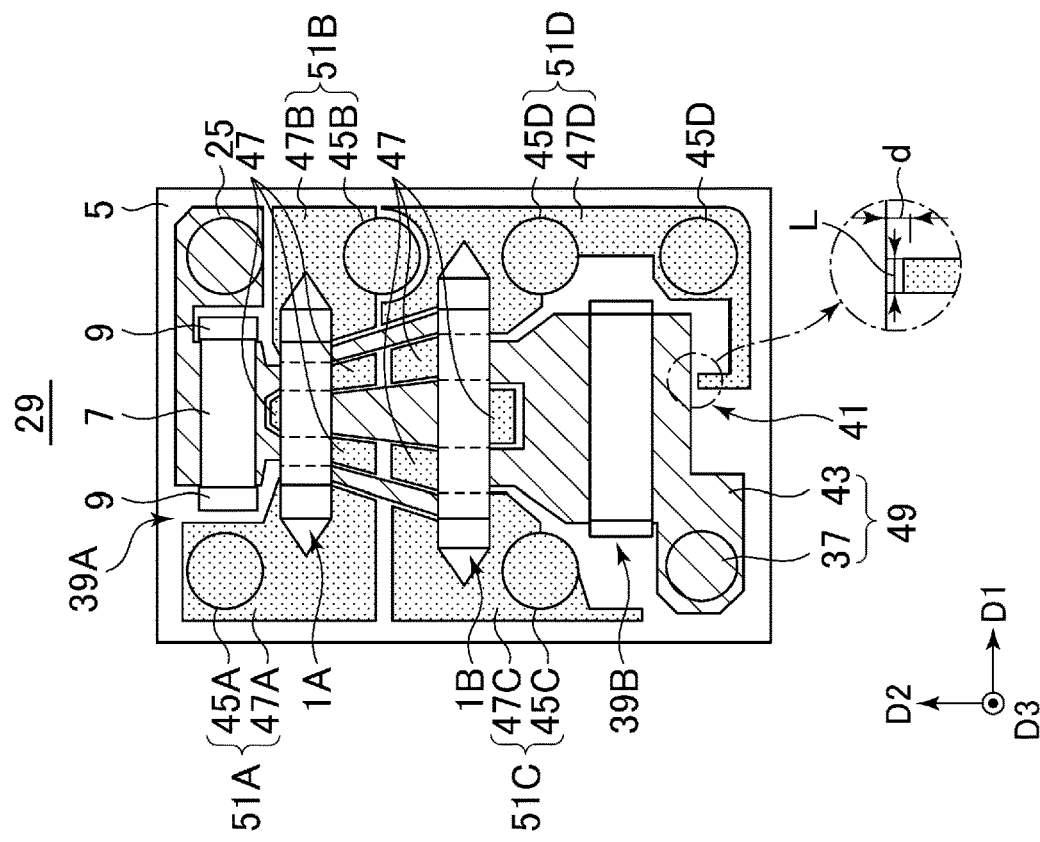

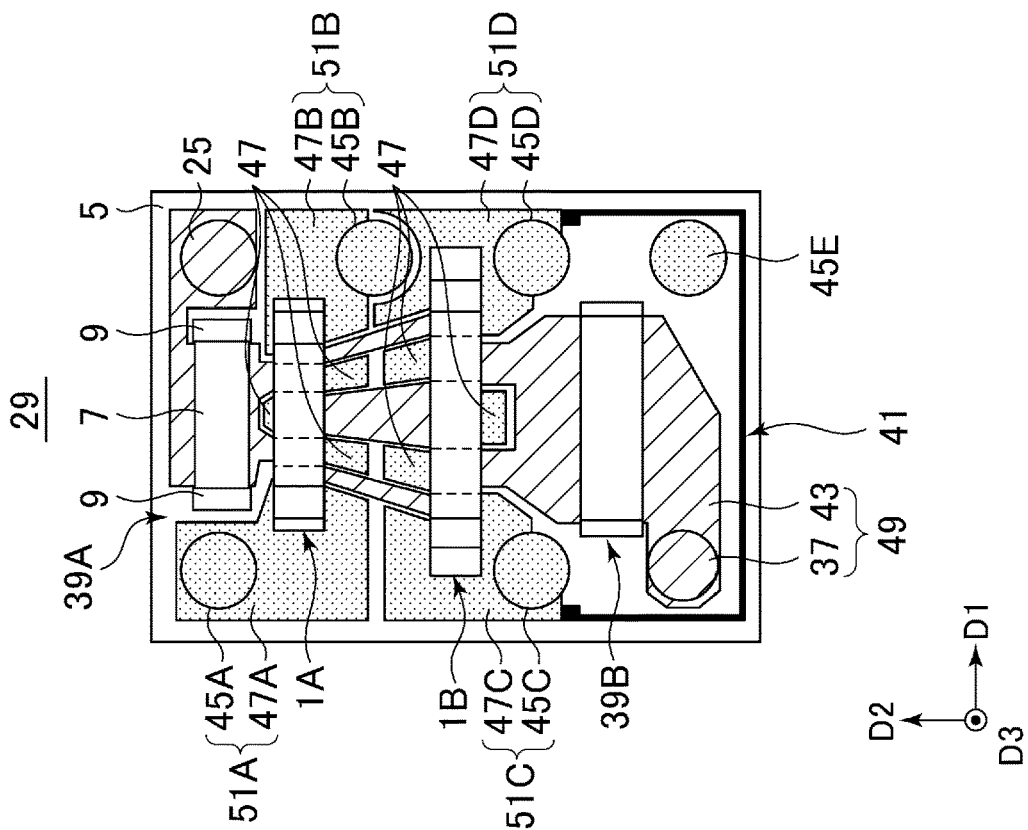
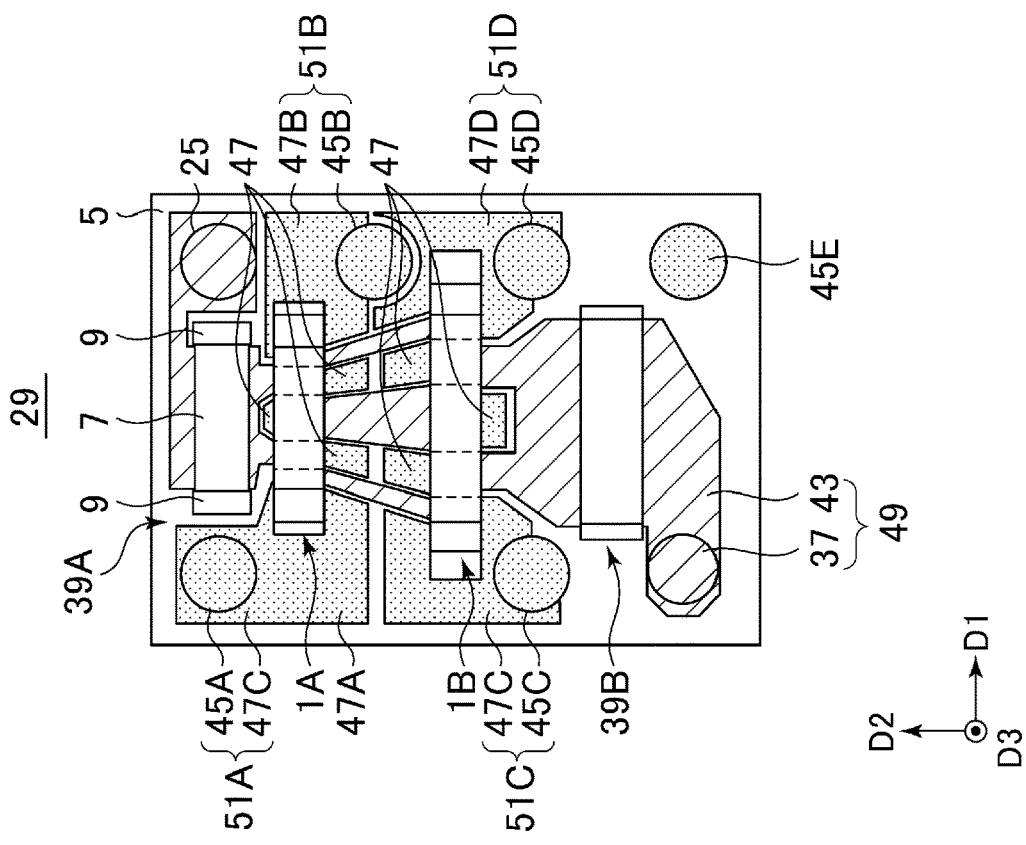

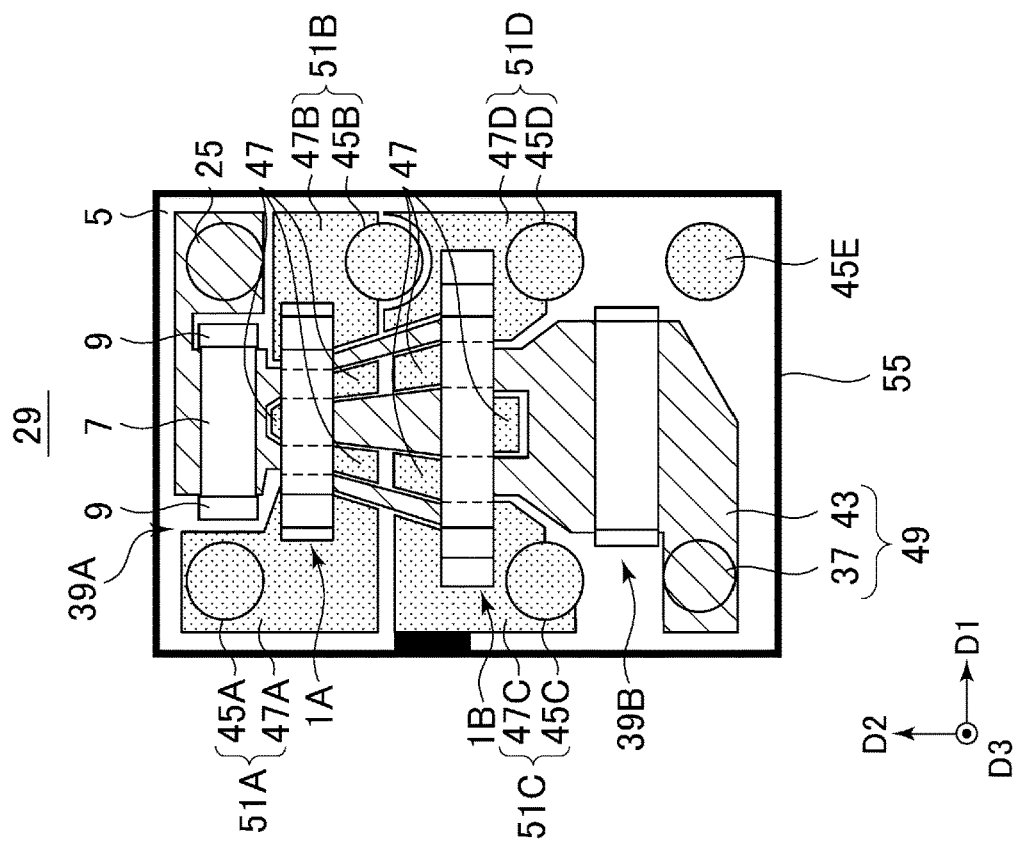
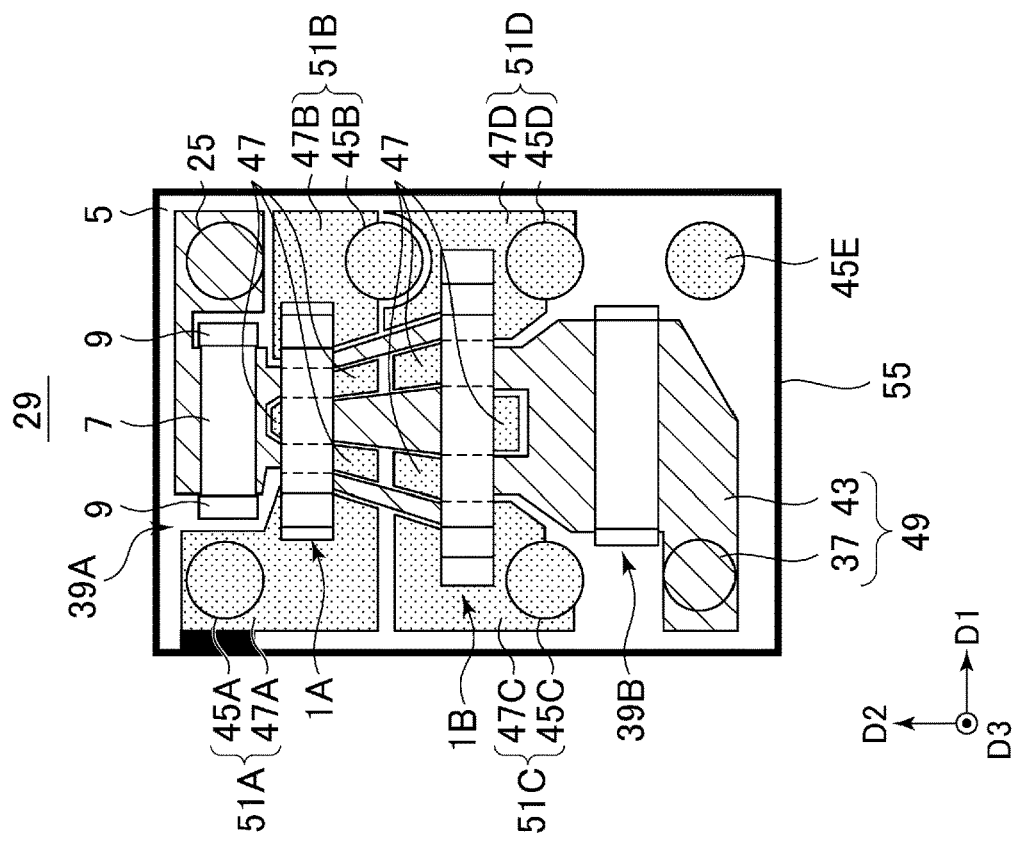

RECEIVING FILTER, MULTIPLEXER, AND COMMUNICATION APPARATUS

TECHNICAL FIELD

The present disclosure relates to a receiving filter, a multiplexer, and a communication apparatus, which filter signals by utilizing an acoustic wave. The acoustic wave is for example a surface acoustic wave (SAW).

BACKGROUND ART

A multiplexer or the like includes a plurality of filters having pass frequency bands (passbands) different from each other. Patent Literature 1 discloses a multiplexer provided with a transmission filter filtering transmission signals output to an antenna and a receiving filter filtering reception signals input from the antenna wherein a longitudinally coupled resonator type filter included in the receiving filter is surrounded by a grounded shield electrode. Patent Literature 1 claims that, due to this, an electric field and magnetic field leaked from the longitudinally coupled resonator type filter to an external portion is short-circuited with the shield electrode and consequently isolation between the receiving filter and the transmission filter can be improved.

CITATION LIST

Patent Literature

Patent Literature 1: Japanese Patent Publication No. 2010-178306A

SUMMARY OF INVENTION

A receiving filter according to one aspect of the present disclosure includes an antenna terminal, a reception terminal, a reception terminal wiring, a first filter, a first reference potential terminal, and a first reference potential wiring. The reception terminal outputs a signal from the antenna terminal. The reception terminal wiring is connected to the reception terminal. The first filter is a longitudinally coupled double-mode type acoustic wave filter which is located in a signal path from the antenna terminal to the reception terminal. The first reference potential terminal is given a reference potential. The first reference potential wiring is connected to the first reference potential terminal and to the first filter. Further, a reception terminal conductor configured by the reception terminal and reception terminal wiring and a first reference potential conductor configured by the first reference potential terminal and the first reference potential wiring are mutually adjacent and capacity-coupled.

A multiplexer according to one aspect of the present disclosure includes an antenna terminal, a transmission filter filtering the signals to the antenna terminal, and the above receiving filter.

A communication apparatus according to one aspect of the present disclosure includes an antenna, a multiplexer described above in which the antenna terminal is connected to the antenna, and an integrated circuit element connected to the transmission filter and to the receiving filter.

BRIEF DESCRIPTION OF DRAWINGS

FIG. 3A is a plan view showing an example of the conductor patterns of a receiving filter.

FIG. 3B is a plan view showing another example of the conductor patterns of the receiving filter.

FIG. 6A is a plan view showing the conductor patterns in a first comparative example.

FIG. 6B is a plan view showing the conductor patterns in a first example.

FIG. 11A is a plan view showing the conductor patterns in a third example.

FIG. 11B is a plan view showing the conductor patterns in a fourth example.

DESCRIPTION OF EMBODIMENTS

Figure 1:
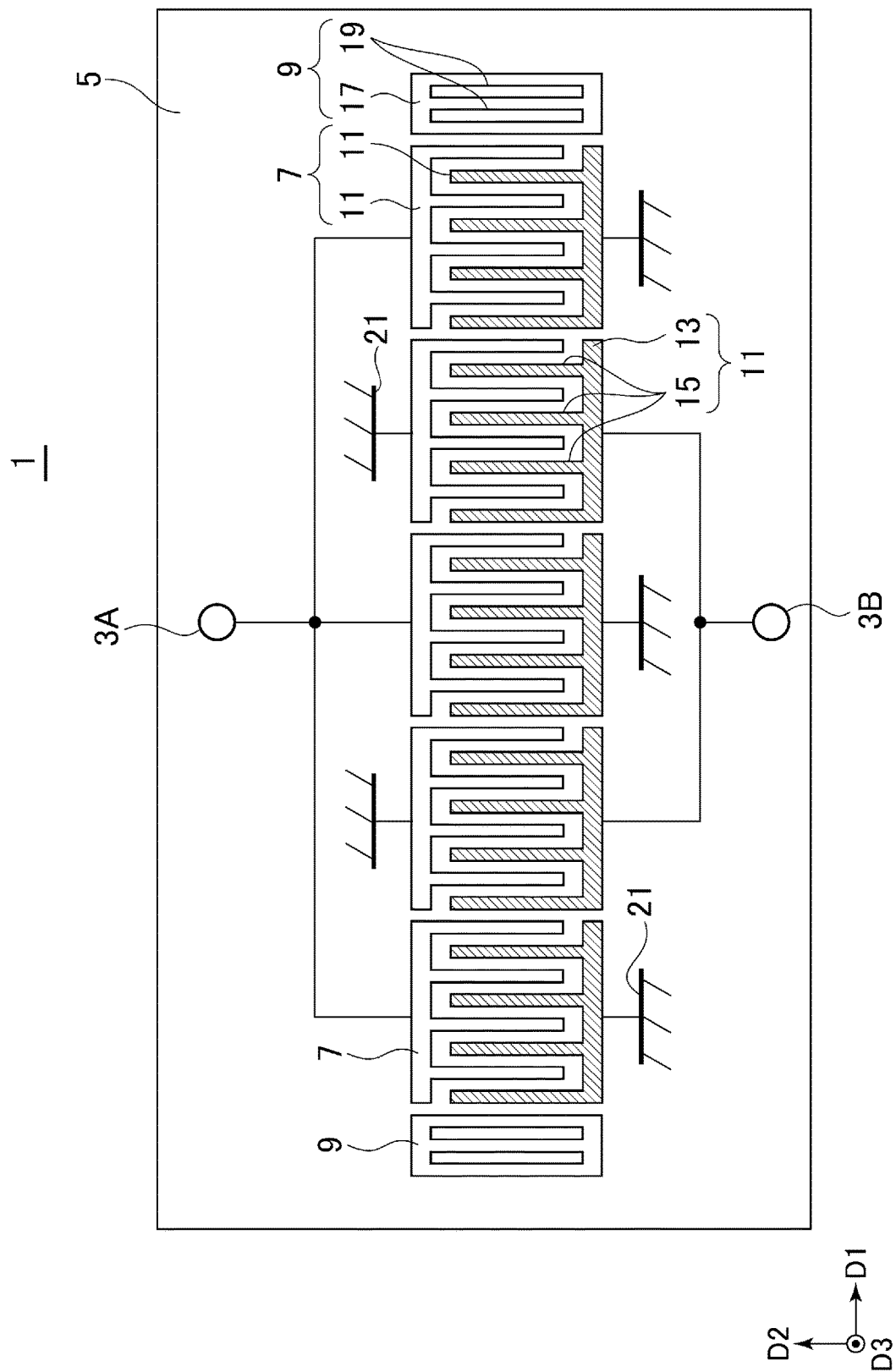
FIG. 1 is a schematic plan view for explaining a fundamental configuration of a SAW filter.

Below, embodiments according to the present disclosure will be explained with reference to the drawings. Note that, the drawings used in the following explanation are schematic ones. Size ratio etc. in the drawings do not always coincide with the actual ones.

The same or similar configurations will be sometimes referred to by attaching different numbers and letters to the same terms such as the "first DMS filter 1A" and "second DMS filter 1B". Further, in this case, sometimes they will be simply referred to as the "DMS filters 1" and will not be differentiated.

(Fundamental Configuration of SAW Filter)

FIG. 1 is a schematic plan view for explaining a fundamental configuration of a SAW resonator or SAW filter. Here, an explanation will be given by taking as an example a longitudinally coupled double-mode type SAW filter.

In the SAW resonator or SAW filter, any direction may be defined as "above" or "below". In the following explanation, however, for convenience, an orthogonal coordinate system comprised of a D1 axis, D2 axis, and D3 axis will be defined, and sometimes use will be made of the "upper surface" and other terms where the positive side of the D3 axis (this side on the drawing sheet in FIG. 1) is the upper part. Note that, the D1 axis is defined so as to become parallel to a direction of propagation of the SAW propagating along the upper surface (the surface on this side of the drawing sheet) of a piezoelectric substrate 5 which will be explained later, the D2 axis is defined so as to be parallel to the upper surface of the piezoelectric substrate 5 and perpendicular to the D1 axis, and the D3 axis is defined so as to be perpendicular to the upper surface of the piezoelectric substrate 5.

The shown DMS (double mode SAW) filter 1 is one filtering electrical signals input from one of a first terminal 3A and a second terminal 3B which are schematically shown and outputting a filtered electrical signal from the other of the first terminal 3A and the second terminal 3B. The DMS filter 1 for example includes a piezoelectric substrate 5, a plurality of (five in the example shown) IDT (interdigital transducer) electrodes 7 provided on the piezoelectric substrate 5, and a pair of reflectors 9 positioned on the two sides of the IDT electrodes 7.

The piezoelectric substrate 5 is for example configured by a single crystal having a piezoelectric characteristic. The single crystal is for example lithium niobate ($LiNbO_3$) single crystal or lithium tantalate ($LiTaO_3$) single crystal. The cut angle may be suitably set in accordance with the type etc. of the SAW utilized. For example, the piezoelectric substrate 5 is a rotated Y-cut and X-propagated one. That is, the X-axis is parallel to the upper surface (D1 axis) of the piezoelectric substrate 5, and the Y-axis is inclined by a predetermined angle relative to the normal line of the upper surface of the piezoelectric substrate 5. Note that, the piezoelectric substrate 5 may be one which is formed relatively thin and to which a support substrate made of an inorganic material, semiconductor material, or organic material is adhered at the back surface (surface on the negative side of the D3 axis) as well.

The IDT electrodes 7 and the reflectors 9 are configured by a layer-shaped conductor provided on the piezoelectric substrate 5. The IDT electrodes 7 and the reflectors 9 are for example configured by materials the same as each other to mutually the same thicknesses. The layer-shaped conductor configuring them is for example a metal. The metal is for example Al or an alloy containing Al as the principal ingredient (Al alloy). The Al alloy is for example an Al—Cu alloy. The layer-shaped conductor may be configured by a plurality of metal layers as well. The thickness of the layer-shaped conductor is suitably set in accordance with electrical characteristics etc. demanded from the resonator or filter (here, DMS filter 1) configured by the IDT electrodes 7 and reflectors 9. As an example, the thickness of the layer-shaped conductor is 50 nm to 400 nm.

Each IDT electrode 7 includes a pair of comb-shaped electrodes 11. Each comb-shaped electrode 11 includes a bus bar 13 and a plurality of electrode fingers 15 extending from the bus bar 13 alongside each other. The pair of comb-shaped electrodes 11 are arranged so that their pluralities of electrode fingers 15 intermesh (intersect) with each other.

Note that, each comb-shaped electrode 11 may include, in addition to the above, for example, a plurality of dummy electrodes which project out among the plurality of electrode fingers 15 from the bus bar 13 to the bus bar 13 side of the other comb-shaped electrode 11 and which face the front ends of the plurality of electrode fingers 15 of the other comb-shaped electrode 11.

The bus bars 13 are for example formed in substantially long shapes linearly extending in the direction of propagation of the SAW (D1 axis direction) with constant widths. Further, the pair of bus bars 13 face each other in the direction (D2 axis direction) perpendicular to the direction of propagation of the SAW. Note that, the bus bars 13 may change in widths or be inclined relative to the direction of propagation of the SAW.

Each electrode finger 15 is for example formed in substantially a long shape linearly extending in the direction (D2 axis direction) perpendicular to the direction of propagation of the SAW with a constant width. In each comb-shaped electrode 11, the plurality of electrode fingers 15 are aligned in the direction of propagation of the SAW. Further, the plurality of electrode fingers 15 in one comb-shaped electrode 11 and the plurality of electrode fingers 15 in the other comb-shaped electrode 11 are basically alternately aligned.

The pitch of the plurality of electrode fingers 15 (for example the distance between the centers of two electrode fingers 15 neighboring each other) is basically constant in each IDT electrode 7. Note that, in a portion of each IDT electrode 7, a narrow pitch portion becoming narrower in pitch than the rest of the part or a broad pitch portion becoming broader in pitch than the rest of the part may be provided as well.

The number of the electrode fingers 15 may be suitably set in accordance with the electrical characteristics etc. demanded from the resonator or filter (here, DMS filter 1) configured by the IDT electrodes 7 and reflectors 9. Note that, FIG. 1 etc. are schematic views, therefore smaller numbers of electrode fingers 15 are shown. In actuality, a larger number of electrode fingers 15 than the shown ones may be aligned. The same is true also for the strip electrodes 19 in the reflectors 9 which will be explained later.

The lengths of the plurality of electrode fingers 15 are for example equivalent to each other. Note that, the IDT electrode 7 may be "apodized" so that the lengths (from another viewpoint, intersecting widths) of the plurality of electrode fingers 15 change in accordance with the positions in the propagation direction. The lengths and widths of the electrode fingers 15 may be suitably set corresponding to the electrical characteristics etc. which are demanded.

The pair of reflectors 9 are positioned on the two sides of the plurality of IDT electrodes 7 in the direction of propagation of the SAW. Each reflector 9 may be for example rendered an electrically floating state or may be given a reference potential. Each reflector 9 is for example formed in a lattice shape. That is, the reflector 9 includes a pair of bus bars 17 facing each other and a plurality of strip electrodes 19 extending between the pair of bus bars 17.

The shapes of the bus bars 17 and strip electrodes 19 may be made the same as those of the bus bars 13 and electrode fingers 15 in the IDT electrodes 7 except that the two ends of the strip electrodes 19 are connected to the pair of bus bars 17. For example, the bus bars 17 are formed in substantially long shapes linearly extending in the direction of propagation of the SAW (D1 axis direction) with constant widths. The strip electrodes 19 are formed in substantially long shapes linearly extending in the direction (D2 axis direction)

perpendicular to the direction of propagation of the SAW with constant widths. The plurality of strip electrodes 19 are aligned in the direction of propagation of the SAW. The pitch of the plurality of strip electrodes 19 and the pitch between the mutually neighboring electrode finger 15 and strip electrode 19 are basically equivalent to the pitch of the plurality of electrode fingers 15.

Note that, although not particularly shown, the upper surface of the piezoelectric substrate 5 may be covered by a protective film made of $SiO_2$ or the like from the tops of the IDT electrodes 7 and reflectors 9. The protective film may be one for simply inhibiting corrosion of the IDT electrodes 7 etc. or may be one contributing to temperature compensation. Further, in a case where a protective film is provided or the like, an additional film made of an insulator or metal may be provided on the upper surfaces or lower surfaces of the IDT electrodes 7 and reflectors 9 in order to improve the reflection coefficient of SAW.

Further, in a SAW device including a SAW resonator or SAW filter (here, DMS filter 1), for example, although not particularly shown, a space permitting vibration of the upper surface of the piezoelectric substrate 5 and facilitating the propagation of the SAW is configured above the piezoelectric substrate 5. This space is for example configured by forming a box-shaped cover to be covered on the upper surface of the piezoelectric substrate 5 or by making the mounting surface of the circuit board and the upper surface of the piezoelectric substrate 5 face each other through bumps.

In the resonator configured by provision of the IDT electrodes 7 on the piezoelectric substrate 5, the resonance frequency becomes substantially equivalent to the frequency of the SAW defining the pitch of the electrode fingers 15 as a half wavelength among the SAWs propagating on the piezoelectric substrate 5 in the direction perpendicular to the pluralities of electrode fingers 15. The antiresonance frequency is defined by the resonance frequency and capacity ratio. The capacity ratio is mainly defined by the material of the piezoelectric substrate 5 and is adjusted by the number, intersecting width or film thickness of the electrode fingers 15 or the like. For the adjustment of the capacity ratio, a capacity element connected parallel to the pair of comb-shaped electrodes 11 may be provided as well.

The DMS filter 1 is a longitudinally coupled type one, therefore the plurality of IDT electrodes 7 are aligned in the direction of propagation of the SAW. Due to this, in the plurality of IDT electrodes 7, SAWs in two modes having mutually different frequencies are excited, so a filter is realized. The SAW in one of the two modes is usually a SAW having the pitch of the electrode fingers 15 as the half wavelength (SAW of 0-order mode, fundamental wave). The other mode is the first or higher order mode and may be suitably set according to the number of IDT electrodes 7 or the like. The center frequency of the passband is substantially equivalent to the frequency of one (0-order mode) of the two modes, and the bandwidth is substantially equivalent to two times a frequency difference of the two modes.

In the DMS filter 1, the number of electrode fingers 15 in each IDT electrode 7 may be suitably set. Between two or more IDT electrodes 7, the numbers may be made equivalent to each other or may be different from each other. Further, the pitch of the electrode fingers 15 (that is, resonance frequency) is basically made equivalent to each other among the plurality of IDT electrodes 7. Further, the pitch of the electrode fingers 15 neighboring each other at the position where the IDT electrodes 7 are neighboring each other may be basically equivalent to the pitch in each IDT electrode 7.

Between the pair of comb-shaped electrodes 11 in each IDT electrode 7, for example, one is connected to the first terminal 3A or second terminal 3B, and the other is connected to a GND part 21.

Note that, a GND part 21 is a portion (for example terminal and/or wiring) given the reference potential. The reference potential is the potential which becomes the reference, but is not limited to 0V.

In each IDT electrode 7, the electrode fingers 15 in the pair of comb-shaped electrodes 11 are basically alternately aligned at a constant pitch. Therefore, between the pair of comb-shaped electrodes 11, the phases of the SAWs (consequently electrical signals) are basically different by 180°. Between the two comb-shaped electrodes 11 positioned on the same side in the D2 axis direction in two neighboring IDT electrodes 7, the phases are the same at the time when the interval between the electrode fingers of the two is an even number multiple of the pitch (half wavelength of SAW), while are different by 180° when the interval is an odd number multiple. Accordingly, in the plurality of IDT electrodes 7 (plurality of comb-shaped electrodes 11), the DMS filter 1 can input or output signals having the same phases or can input or output signals having phases different by 180°.

The DMS filter 1 may be one receiving as input an unbalanced signal or may be one receiving as input a balanced signal. Further, the DMS filter 1 may be one outputting an unbalanced signal or may be one outputting a balanced signal. Here, an unbalanced signal is comprised of one electrical signal having a potential with respect to a reference potential as the signal level. A balanced signal is comprised of two electrical signals having phases different by 180° from each other (from another viewpoint, having potentials which are different from each other) and has the difference of the potentials as the signal level.

FIG. 1 illustrates an aspect in which an unbalanced signal is input and an unbalanced signal is output. Specifically, the relative positions of the plurality of IDT electrodes 7 are set so that, between two IDT electrodes 7 which are one electrode away from each other, the phases of the comb-shaped electrodes 11 positioned on the same side in the D2 axis direction become the same. Both of those comb-shaped electrodes 11 on the same side which are one electrode away from each other are connected to the first terminal 3A or the second terminal 3B. Note that, between two neighboring IDT electrodes 7, the phases of the comb-shaped electrodes 11 which are positioned on the same side in the D2 axis direction may be the same or may be different by 180°. From another viewpoint, the input signal and the output signal may be different in phases by 180° or may be the same.

(Multiplexer)

Figure 2:
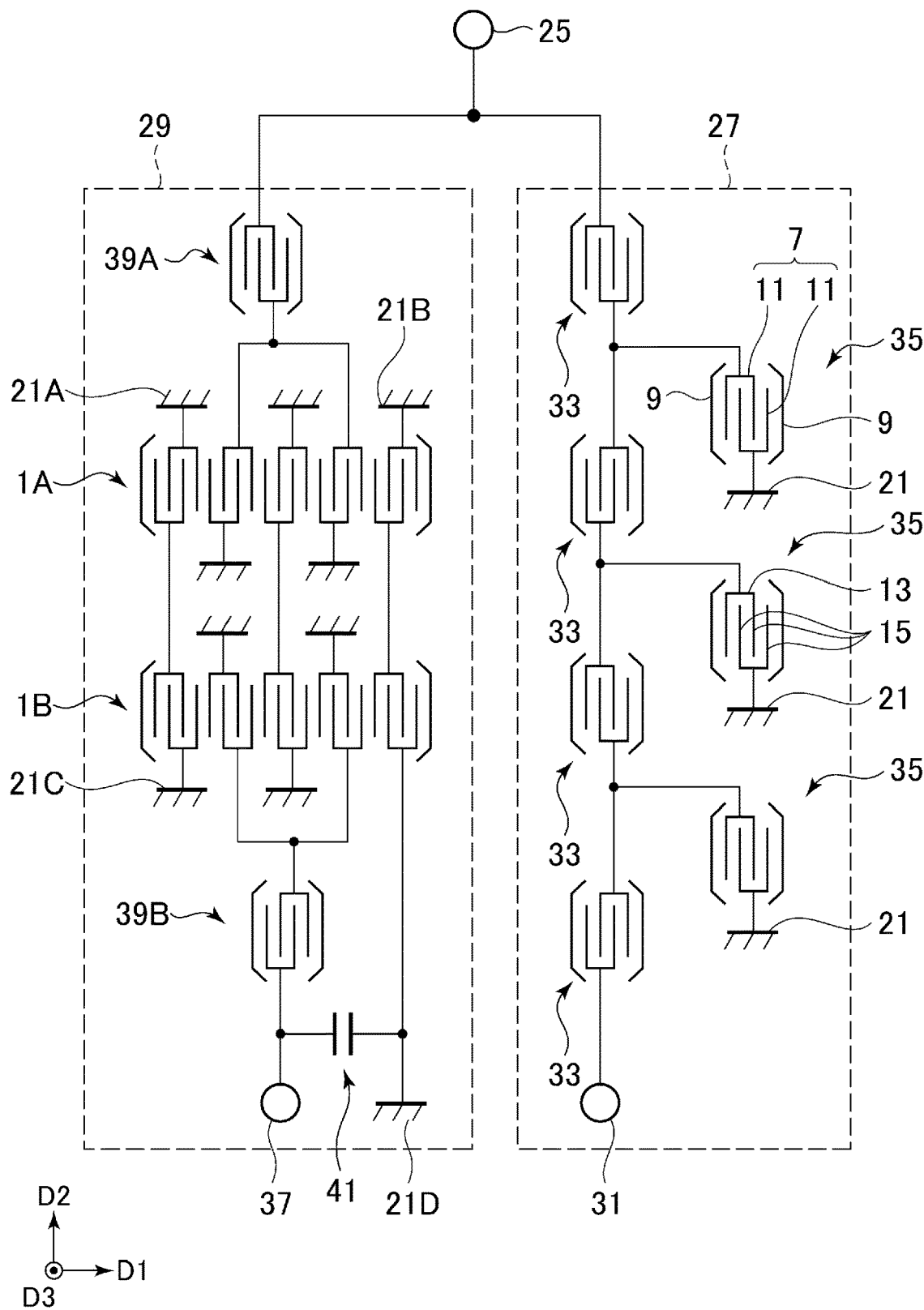
FIG. 2 is a circuit diagram showing the configuration of a multiplexer according to an embodiment.

FIG. 2 is a schematic view showing the configuration of a multiplexer 23. In this view, as understood from the notations 7, 9, 11, 13, and 15, the IDT electrodes 7 and reflectors 9 are more schematically shown than in FIG. 1.

The multiplexer 23 includes an antenna terminal 25 connected to a not shown antenna, a transmission filter 27 filtering transmission signals to the antenna terminal 25, and a receiving filter 29 filtering reception signals from the antenna terminal 25. Note that, here, the antenna terminal 25 is grasped as a part different from the transmission filter 27 and receiving filter 29. However, the antenna terminal 25 may be grasped as a portion of the transmission filter 27 and/or receiving filter 29 as well.

(Transmission Filter)

The transmission filter 27 is for example configured by a so-called "ladder type" SAW filter. That is, the transmission filter 27 includes a transmission terminal 31 to which transmission signals are input, a plurality of (four in the example shown) serial resonators 33 which are connected in series to each other between this transmission terminal 31 and the antenna terminal 25, and a plurality of (three in the example shown) parallel resonators 35 which connect that serial line and GND parts 21.

Each of the plurality of serial resonators 33 and plurality of parallel resonators 35 is configured by a so-called 1-port SAW resonator. The 1-port SAW resonator includes a piezoelectric substrate 5 (see FIG. 1), one IDT electrode 7 provided on the piezoelectric substrate 5, and a pair of reflectors 9 which are provided on the piezoelectric substrate 5 and are positioned on the two sides of the one IDT electrode 7 in the direction of propagation of the SAW. The configurations of the IDT electrode 7 and reflectors 9 and the interval between the IDT electrode 7 and the reflectors 9 (the pitch between the electrode fingers 15 and the strip electrodes 19 which are adjacent to each other) are as explained with reference to FIG. 1.

In each serial resonator 33, between the pair of comb-shaped electrodes 11, one comb-shaped electrode 11 is connected to the antenna terminal 25 through the other serial resonator 33 or without going through it, while the other comb-shaped electrode 11 is connected to the transmission terminal 31 through the other serial resonator 33 or without going through it. In each parallel resonator 35, one comb-shaped electrode 11 between the pair of comb-shaped electrodes 11 is connected to the serial line (serial arm) connecting the antenna terminal 25 and the transmission terminal 31, while the other comb-shaped electrode 11 is connected to a GND part 21.

The frequency characteristics (for example resonance frequencies and antiresonance frequencies) of the plurality of serial resonators 33 are basically the same as each other. The frequency characteristics (for example resonance frequencies and antiresonance frequencies) of the plurality of parallel resonators 35 are basically the same as each other. Further, the serial resonators 33 and the parallel resonators 35 are set in their characteristics so that basically the antiresonance frequencies of the parallel resonators 35 substantially coincide with the resonance frequencies of the serial resonators 33. The center frequency of the passband becomes substantially the resonance frequencies of the serial resonators 33.

In the transmission filter 27, the transmission terminal 31, all IDT electrodes 7, and all reflectors 9 are for example provided on the same surface of the same piezoelectric substrate 5. The numbers of the serial resonators 33 and parallel resonators 35 may be suitably set. In principle, one each may be provided as well. Further, the plurality of serial resonators 33 may be finely adjusted so that their resonance frequencies and antiresonance frequencies etc. differ a little from each other. In the same way, the plurality of parallel resonators 35 may be finely adjusted so that their resonance frequencies and antiresonance frequencies etc. differ a little from each other. The transmission filter 27 may include a configuration other than resonators such as inductors, capacity elements, or the like at suitable positions as well.

(Receiving Filter)

The receiving filter 29 includes a DMS filter 1 explained with reference to FIG. 1 as a principal component. Specifically, for example, the receiving filter 29 includes a reception terminal 37 outputting the reception signals and includes a first auxiliary resonator 39A, first DMS filter 1A, second DMS filter 1B, and second auxiliary resonator 39B which are serially connected in that order from the antenna terminal 25 to the reception terminal 37.

Each of the first auxiliary resonator 39A and the second auxiliary resonator 39B is for example configured by a so-called 1-port SAW resonator. The configuration of the 1-port SAW resonator is as already explained. In the first auxiliary resonator 39A, one comb-shaped electrode 11 in the pair of comb-shaped electrodes 11 is connected to the antenna terminal 25, while the other comb-shaped electrodes 11 is connected to the first DMS filter 1A. In the second auxiliary resonator 39B, one comb-shaped electrode 11 in the pair of comb-shaped electrodes 11 is connected to the second DMS filter 1B, while the other comb-shaped electrode 11 is connected to the reception terminal 37. The auxiliary resonator 39 is for example configured so that the resonance frequency is within the passband of the DMS filter 1 and the antiresonance frequency is out of the passband of the DMS filter 1 and is positioned at a frequency where an attenuation amount falls in the DMS filter 1. Note that, such an auxiliary resonator 39 need not be provided either.

The first DMS filter 1A and second DMS filter 1B are the same as the DMS filter 1 explained with reference to FIG. 1. The number of the IDT electrodes 7 is five, unbalanced signals are input, and unbalanced signals are output in the same way as FIG. 1.

In the first DMS filter 1A, for example, the second terminal 3B side in FIG. 1 corresponds to the antenna terminal 25 side, while the first terminal 3A side corresponds to the reception terminal 37 side. In the first DMS filter 1A, signals are input from the first auxiliary resonator 39A to two IDT electrodes 7, while signals are output from three IDT electrodes 7 to the second DMS filter 1B.

In the second DMS filter 1B, for example, the first terminal 3A side in FIG. 1 corresponds to the antenna terminal 25 side, while the second terminal 3B side corresponds to the reception terminal 37 side. In the second DMS filter 1B, signals are input from the first DMS filter 1A to three IDT electrodes 7, while signals are output from two IDT electrodes 7 to the second auxiliary resonator 39B.

In each of the plurality of IDT electrodes 7 in the DMS filters 1, one of the pair of comb-shaped electrodes 11 is connected to a GND part 21. For convenience of the later explanation, among the plurality of GND parts 21, the GND parts 21 which are connected to the IDT electrodes 7 at the two side parts in the first DMS filter 1A will be referred to as the "first GND part 21A" and "second GND part 213", while the GND parts 21 which are connected to the IDT electrodes 7 at the two side parts in the second DMS filter 1B will be referred to as the "third GND part 21C" and "fourth GND part 21D".

In the receiving filter 29, the reception terminal 37, all IDT electrodes 7, and all reflectors 9 are for example provided on the same surface of the same piezoelectric substrate 5. Further, the antenna terminal 25, transmission filter 27, and receiving filter 29 are for example provided on the same surface of the same piezoelectric substrate 5. However, the transmission filter 27 and the receiving filter 29 may be provided on mutually different piezoelectric substrates 5 as well.

(Capacity Coupling in Receiving Filter)

The reception terminal 37 and the GND part 21 connected to the DMS filter 1 (in the example shown, the fourth GND part 21D) are capacity-coupled. From another viewpoint, a capacity element part 41 is configured between the reception terminal 37 and the fourth GND part 21D. Due to this, isolation between the receiving filter 29 and the transmission filter 27 is improved.

Although not shown here, a GND part 21 is for example configured by a terminal given the reference potential from a circuit outside the multiplexer 23 and/or wiring connected to this terminal. Further, the above capacity coupling is for example realized by the reception terminal 37 and/or the wiring connected to the reception terminal 37 and the fourth GND part 21D adjacent to each other.

(Example of Specific Conductor Patterns Realizing Capacity Coupling)

FIG. 3A is a plan view showing an example of the conductor patterns in the receiving filter 29.

In this view, the auxiliary resonators 39 and the DMS filters 1 are schematically shown. Specifically, in the auxiliary resonators 39, the ranges in which the IDT electrodes 7 are arranged and the ranges in which the reflectors 9 are arranged are indicated by white rectangles. Note that, the IDT electrodes 7 in the auxiliary resonators 39 may be divided in the D2 axis direction (may be configured by pluralities of IDT electrodes). However, even in such an aspect, they are shown by single rectangles. In each DMS filter 1, the entire range of arrangement of the plurality of IDT electrodes 7 is indicated by one white rectangle, and boundaries between the IDT electrodes 7 are indicated by dotted lines. The ranges in which the reflectors 9 are arranged in the DMS filter 1 are indicated by white rectangles.

Regions indicated by hatchings show conductor patterns provided on the upper surface of the piezoelectric substrate 5 (excluding the auxiliary resonators 39 and DMS filters 1). Regions indicated by oblique hatchings show conductor patterns given the reception signals. Regions indicated by dotted hatchings show conductor patterns given the reference potentials. These conductors are for example configured by a conductive layer made of the same material as that of the conductive layer configuring the IDT electrodes 7 and reflectors 9 to the same thickness. Note that, the terminals may include a conductive layer made of another material on the conductive layer common to the other parts as well.

The conductors given signals include for example the antenna terminal 25 and reception terminal 37 (regions surrounded by circles). Further, these conductors, as understood also from the comparison of FIG. 3A and FIG. 2, include for example a wiring (notation omitted) which extends from the antenna terminal 25 to the first auxiliary resonator 39A, a wiring (notation omitted) which extends from the first auxiliary resonator 39A to the first DMS filter 1A and is branched to two in the middle, three wirings (notations omitted) which extend from the first DMS filter 1A to the second DMS filter 1B, two wirings (notations omitted) which extend from the second DMS filter 1B to the second auxiliary resonator 39B and join together in the middle, and a reception terminal wiring 43 which extends from the second auxiliary resonator 39B to the reception terminal 37. Note that, suitable modifications may also be made such as provision of a wiring mutually connecting the three wirings connecting the first DMS filter 1A and the second DMS filter 1B or the center wiring among the three wirings may be divided into two.

The conductors given the reference potentials include for example GND terminals 45 (regions surrounded by circles). The first GND terminal 45A to the fourth GND terminal 45D (in this example, there are two fourth GND terminals 45D) respectively configure the first GND part 21A to the fourth GND part 21D in FIG. 2. Further, the conductors given the reference potentials include GND wirings 47 connecting the GND terminals 45 and the DMS filters 1.

As will be understood also from a comparison of FIG. 3A and FIG. 2, the GND wirings 47 connect the GND terminals 45 and DMS filters 1 in the following way. The first GND wiring 47A connects the first GND terminal 45A and the comb-shaped electrode 11 on the positive side of the D2 axis in the IDT electrode 7 positioned at the end part on the negative side of the D1 axis in the first DMS filter 1A. The second GND wiring 47B connects the second GND terminal 45B and the comb-shaped electrode 11 on the positive side of the D2 axis in the IDT electrode 7 positioned at the end part on the positive side of the D1 axis in the first DMS filter 1A. The third GND wiring 47C connects the third GND terminal 45C and the comb-shaped electrode 11 on the negative side of the D2 axis in the IDT electrode 7 positioned at the end part on the negative side of the D1 axis in the second DMS filter 1B. The fourth GND wiring 47D connects the fourth GND terminal 45D and the comb-shaped electrode 11 on the negative side of the D2 axis in the IDT electrode 7 positioned at the end part on the positive side of the D1 axis in the second DMS filter 1B. Note that, the connection of the comb-shaped 11 in the IDT electrode 7 positioned at the end part in the DMS filter 1 and the GND wiring 47 may be carried out through the reflector 9 as well.

The GND wirings 47 which are not given additional notations A to D are for example connected with closest wirings among the first GND wiring 47A to the fourth GND wiring 47D by not shown wirings three-dimensionally intersecting wirings given signals through not shown insulation layers. More specifically, the GND wirings 47 on the first DMS filter 1A side are respectively connected to the first GND wiring 47A or second GND wiring 47B, while the GND wirings 47 on the second DMS filter 1B side are respectively connected to the third GND wiring 47C or fourth GND wiring 47D. That is, the GND wirings 47 of the first DMS filter 1A are combined at the first DMS filter 1A, while the GND wirings 47 of the second DMS filter 1B are combined at the second DMS filter 1B. In place of three-dimensional intersection through the insulation layer, bonding wires may be used as well.

The first GND wiring 47A to the fourth GND wiring 47D are separated from each other. The first GND wiring 47A and the second GND wiring 47B which are connected to the first DMS filter 1A may be connected to each other by a not shown three-dimensional wiring or need not be connected. In the same way, the third GND wiring 47C and the fourth GND wiring 47D which are connected to the second DMS filter 1B may be connected to each other by a not shown three-dimensional wiring or need not be connected. Note that, below, unless particularly explained, the third GND wiring 47C and the fourth GND wiring 47D are not connected.

The GND wirings (for example 47A and 47B) connected to the first DMS filter 1A, and the GND wirings (for example 47C and 47D) connected to the second DMS filter 1B are for example not connected to each other. However, an embodiment where these are connected with each other is also included in the present disclosure.

On the various types of terminals (25, 37, and 45), for example, bumps made of solder or the like which are interposed between the piezoelectric substrate 5 and a not shown mounting substrate which is arranged so as to face the piezoelectric substrate 5 or columnar terminals passing through a cover covering the piezoelectric substrate 5 are arranged. Single ends of the bonding wires may be bonded on the various terminals as well. In the conductor patterns on the piezoelectric substrate 5, there need not be boundaries due to the configurations of the terminals or wirings (for example, change of the material or change of the shape) between the terminals and the wirings connected to the terminals.

Among the conductor patterns given signals, the portion configured by the reception terminal 37 and the reception terminal wiring 43 continuing from the reception terminal 37 is defined as the "reception terminal conductor 49". In the example in FIG. 3A, among the conductor patterns given the signals, the portion on the side closer to the reception terminal 37 than the second DMS filter 1B concerning the electrical route is the reception terminal conductor 49. Further, among the conductor patterns given the reference potential, the portion configured by a GND terminal 45 and a GND wiring 47 continuing from the GND terminal 45 is defined as a "GND conductor 51". For example, in the example in FIG. 3A, among the conductor patterns given the reference potential, the portion connected to the second DMS filter 1B concerning the electrical route and also on the side closer to the fourth GND terminal 45D than this is the fourth GND conductor 51D. Further, the reception terminal conductor 49 and the fourth GND conductor 51D are adjacent and are capacity-coupled (the capacity element part 41 is configured).

Specifically, for example, the fourth GND wiring 47D has a portion extending to the side opposite to the second DMS filter 1B from the fourth GND terminal 45D (either of the two may be considered as the reference) concerning the electrical route. This portion is adjacent to the reception terminal wiring 43. Any portions in the two wirings may be adjacent as well. In the example shown, however, the front end of the fourth GND wiring 47D and the side surface of the reception terminal wiring 43 are adjacent.

Note that, by providing two fourth GND terminals 45D, it is possible to provide a route which is connected to the reference potential on the side closer to the second DMS filter 1B than the capacity part 41. By employing such a configuration, stabilization of the reference potential is realized, and the inductance component can be adjusted, therefore a receiving filter 29 with a smaller loss can be realized. In this way, a plurality of routes to the reference potential may be provided as well.

(Capacity of Capacity Element Part)

The capacity of the capacity element part 41 is for example 0.03 pF or more or 0.1 pF or more. If the capacity is 0.03 pF or more, for example, the effect of improvement of isolation due to the capacity coupling can be confirmed. If the capacity is 0.1 pF or more, for example, the effect of improvement of isolation due to the capacity coupling becomes conspicuous. Note that, the upper limit is for example 1 pF. If the capacity is 1 pF or less, for example, impedance matching in the bandwidth is relatively easy, and loss can be reduced. Further, the capacity may be made 0.1 pF to 0.7 pF as well. In this case, for example, isolation is improved, and the loss can be reduced. In more detail, the capacity may be controlled to 0.4 pF to 0.6 pF as well.

In order to realize the capacity described above, a distance "d" between the reception terminal conductor 49 and a GND conductor 51 in the capacity element part 41 (from another viewpoint, the minimum interval between the reception terminal conductor 49 and a GND conductor 51) and the length L over which the two face may be suitably set. For example, consider a case where the piezoelectric substrate 5 is configured by a lithium tantalate single crystal having a thickness of 250 μm and the conductor is configured by aluminum having a thickness of 0.16 μm.

In this case, for example, assume that each of the reception terminal conductor 49 and the GND conductor 51 is configured by a rectangle of 100 μm×100 μm and the length L is 100 μm. At this time, the changes of the capacity C with respect to changes of the distance "d" are as follows.

| d | C |
|---|---|
| 1 μm | 0.08 pF |
| 5 μm | 0.06 pF |
| 10 μm | 0.05 pF |
| 20 μm | 0.045 pF |
| 50 μm | 0.035 pF |

Further, for example, assume that one of the reception terminal conductor 49 and a GND conductor 51 is configured by a rectangle of 10 μm×300 μm, the other is configured by a rectangle of 100 μm×300 μm, and the length L is 300 μm. At this time, changes of the capacity C with respect to changes of the distance "d" are as follows.

| d | C |
|---|---|
| 1 μm | 0.18 pF |
| 5 μm | 0.13 pF |
| 10 μm | 0.11 pF |
| 20 μm | 0.09 pF |
| 50 μm | 0.07 pF |

Accordingly, if the distance "d" is made substantially 20 μm or less, even if the length L is about 100 μm, a capacity of 0.03 pF or more can be reliably secured. Further, a capacity of 0.1 pF or more can be secured with a length L of about 300 μm.

The wavelength of the SAW (two times the pitch of the electrode fingers 15) is for example 1.5 μm to 6 μm though it depends upon the type of the SAW used and the demanded resonance frequency. In one IDT electrode 7, for example, several dozen or a 100 or more electrode fingers 15 are provided. Accordingly, when considering the size of the IDT electrode 7, it is realistic to secure 100 μm or 300 μm as the length L.

The conductors such as the wirings or terminals are spaced apart with each other at relatively wide distances unlike the electrode fingers 15 when capacity-coupling as in the present disclosure is not intended. This is done for the purpose of reducing the probability of unwanted capacity-coupling or reducing the probability of short-circuiting. In particular, in terminals to which solder or other bumps are bonded, a large distance is taken from the other conductors considering even error in shaping of the bumps. For example, the conductors are spaced apart from each other by tens of microns or more. Accordingly, usually a distance "d" of 20 μm or less is not formed.

In the same way, in order to secure the capacity C, when the distance "d" is made 20 μm or less, in more detail, 1.5 μm to 10 μm, this distance can be realized by formation of thin film patterns and a patterning process on the piezoelectric substrate 5. Conversely speaking, it is difficult to realize that distance by printing a thick film and its patterning process and it is difficult to impart this function to an organic substrate, ceramic multi-layer substrate, and the like. That is, by forming the capacity part 41 on the same substrate as that for the second DMS filter 1B, a desired capacity can be realized.

From the viewpoint of securing the capacity while making the length L short, preferably the distance "d" is as small as possible. On the other hand, if the distance "d" becomes small, the possibility of short-circuiting arises due to processing error. Accordingly, for example, the distance "d" is not less than the interval of the electrode fingers 15 (distance between the mutually facing sides of the neighboring electrode fingers 15) or not less than the pitch of the electrode fingers 15 or 1 μm or more. In this case, the inconvenience of having to raise the processing precision only for the formation of the capacity element part 41 does not arise.

(Examples of Other Conductor Patterns)

FIG. 3B is a plan view showing another example of the conductor patterns in the receiving filter 29.

This example differs from FIG. 3A in the point that there is only one fourth GND terminal 45D, in the point that capacity element parts 41 are configured at a plurality of positions (two positions in the example shown), and in the specific shapes of the conductor patterns of the capacity element parts 41. The rest is substantially the same as the example in FIG. 3A although differing somewhat.

The number and the positions of GND terminals 45 included in the GND conductors 51 are arbitrary as shown in this example in which the number of the fourth GND terminals 45D is reduced compared with the example in FIG. 3A. However, if a plurality of GND terminals 45 are included in the GND conductors 51 which are capacity-coupled with the reception terminal conductor 49, it becomes easier to stabilize the potentials of the GND conductors 51.

One of the two capacity element parts 41, in the same way as the example in FIG. 3A, is configured by the reception terminal conductor 49 and the fourth GND conductor 51D adjacent to each other. The other capacity element part 41 is configured by the reception terminal conductor 49 and the third GND conductor 51C adjacent to each other. Note that, the third GND conductor 51C, in the same way as the fourth GND conductor 51D, is connected to the second DMS filter 1B and is not connected to the first DMS filter 1A (the GND conductors 51 connected to the first DMS filter LA).

By configuring the capacity element part 41 at a plurality of positions in this way, for example, it is made easier to secure the capacity. Further, for example, by configuring the capacity element parts 41 by the plurality of GND conductors 51 which are connected to the mutually different IDT electrodes 7 in the second DMS filter 1B, configuration of the capacity element part 41 at a plurality of positions is facilitated. By capacity-coupling the reception terminal conductor 49 with the plurality of mutually different GND conductors 51, for example, stabilization of the effect of improving the isolation is expected as well.

In the example in FIG. 3A, the side surface in the rectangular shaped portion in the reception terminal wiring 43 and the front end face of the rectangular shaped portion in the fourth GND wiring 47D face each other to configure the capacity element part 41. Contrary to this, in the example in FIG. 3B, the inclined surface on the outside of the bending portion in the reception terminal wiring 43 and the inclined surface of a triangular shaped portion provided at the front end part of the fourth GND wiring 47D face each other to configure the capacity element part 41. In this way, the patterns of the conductors configuring the capacity element part 41 may be any patterns.

Figure 3C:
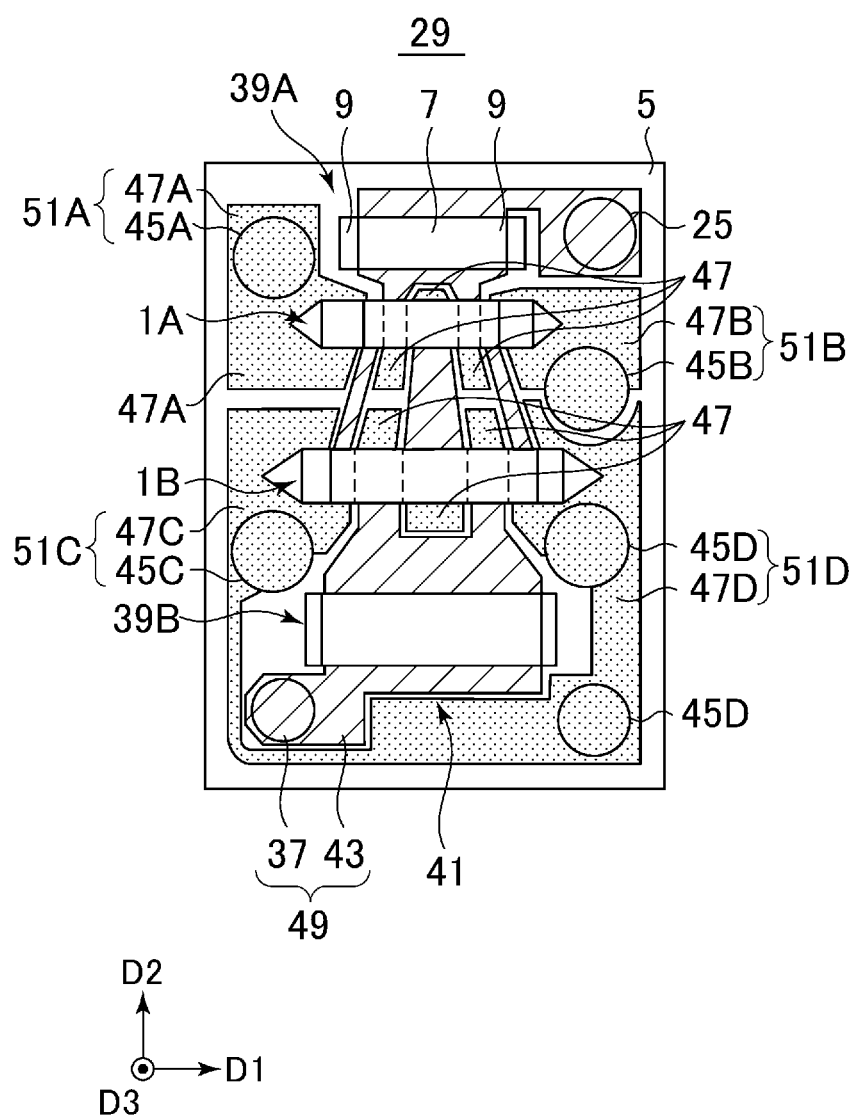
FIG. 3C is a plan view showing still another example of the conductor patterns of the receiving filter.

FIG. 3C is a plan view showing still another example of the conductor patterns of the receiving filter 29.

In comparison with FIG. 3A, this example is different in the point that the third GND wiring 47C and the fourth GND wiring 47D are mutually connected and the point that the third GND conductor 51C and the fourth GND conductor 51D extend so as to surround the reception terminal conductor 49 by the third GND conductor 51C, fourth GND conductor 51D, and second DMS filter 1B. Note that, for convenience of comparison with FIG. 3A, the third GND conductor 51C and the fourth GND conductor 51D are differentiated. However, the two may be grasped as one GND conductor 51.

When forming the third GND conductor 51C and fourth GND conductor 51D in this way, for example, it is made easier to make the length L with which these conductors and the reception terminal conductor 49 face longer. In the example shown, the reception terminal wiring 43 is bent in a side surface on the outer circumferential side of the piezoelectric substrate 5. On the other hand, in the fourth GND wiring 47D, the side surface on the inner circumferential side of the piezoelectric substrate 5 is shaped so as to be similar to the shape of the side surface of the reception terminal wiring 43. Therefore the two side surfaces face over a relatively long distance. Further, by the third GND conductor 51C and the fourth GND conductor 51D surrounding the reception terminal conductor 49, these GND conductors 51 is expected to be function as a shield.

Further, a necessary and sufficient capacity can be formed by surrounding the reception terminal conductor 49 by the third GND conductor 51C and the fourth GND conductor 51D, therefore a distance from the auxiliary resonator 39B can be secured. By employing such a configuration, unintended coupling with the auxiliary resonator 39B is suppressed, therefore it becomes possible to sufficiently obtain the effect of improvement of the attenuation characteristic by the auxiliary resonator 39B.

(Examples: Influence of Capacity)

The characteristics of the multiplexer 23 including the receiving filter 29 having the conductor patterns shown in FIG. 3A were studied by simulation calculation. At this time, the influence of the capacity was studied by changing the capacity of the capacity element part 41.

As the multiplexer 23, use was made of one corresponding to the UMTS (universal mobile telecommunications system) band 3 (transmission band: 1710 to 1785 MHz, reception band: 1805 to 1880 MHz). Note that, in the UMTS band 3, the reception band is higher in frequency than the transmission band. The capacity was made 0.00 pF (comparative example), 0.03 pF, 0.065 pF, 0.10 pF, 0.15 pF, 0.20 pF, or 0.30 pF.

Figure 4A:
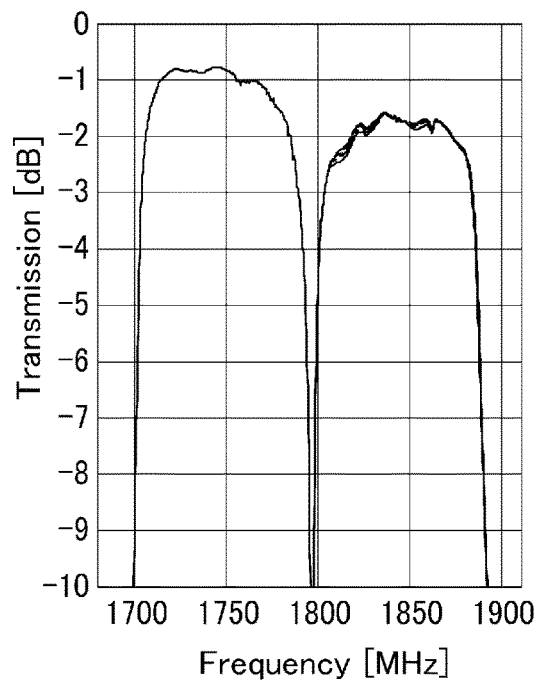
FIG. 4A, FIG. 4B, FIG. 4C, and FIG. 4D are graphs showing results of simulation calculation for checking an influence of the capacity.
Figure 4B:
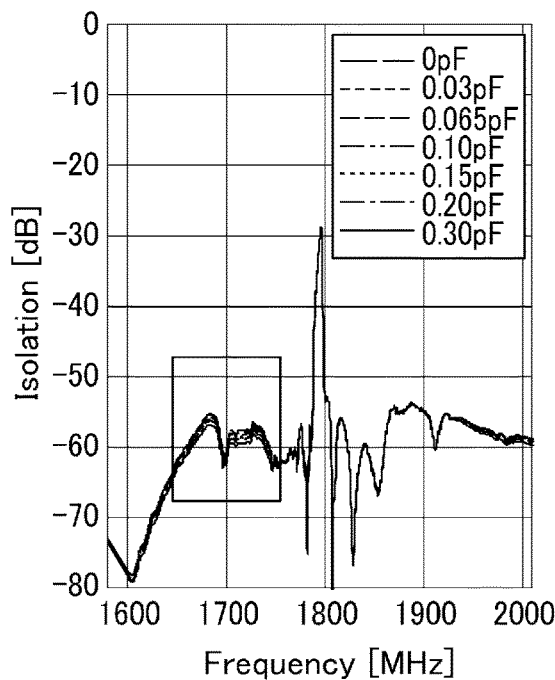
Figure 4C:
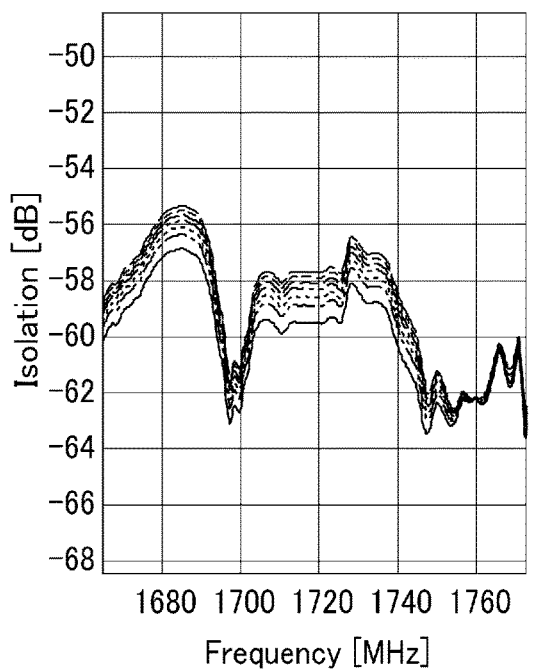
Figure 4D:
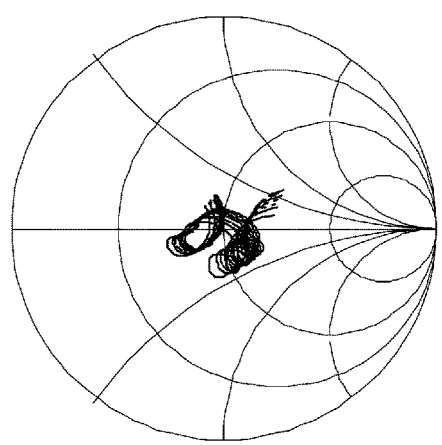
Figure 5A:
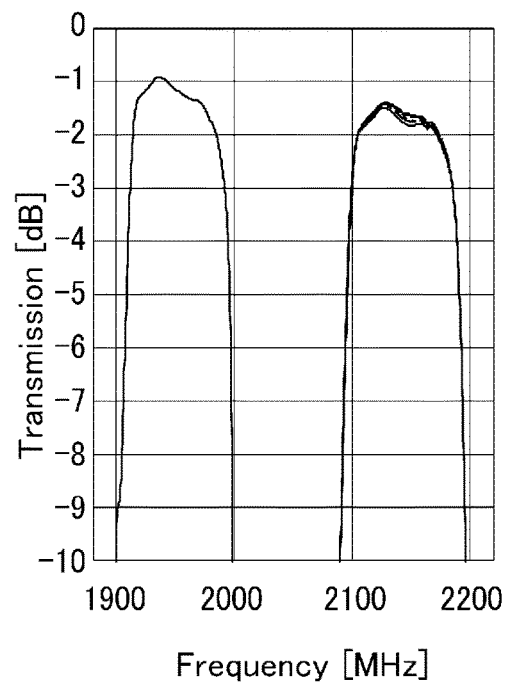
FIG. 5A, FIG. 5B, FIG. 5C, and FIG. 5D are graphs showing the results of simulation calculation for checking the influence of the capacity for bands different from those in FIG. 4A to FIG. 4D.
Figure 5B:
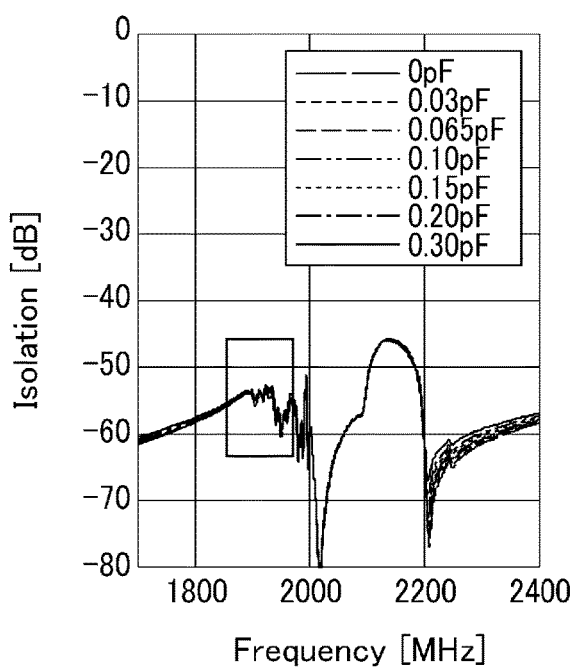
Figure 5C:
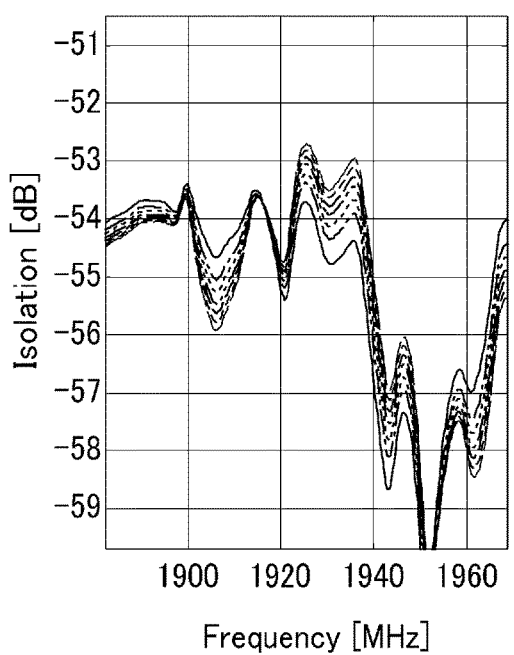
Figure 5D:
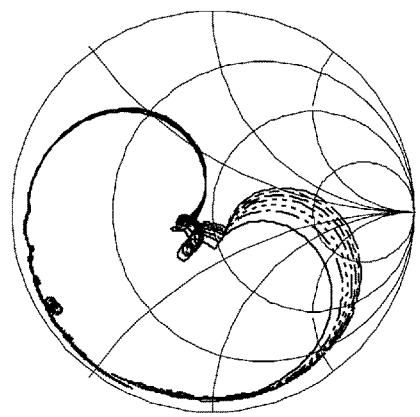

FIG. 4A to FIG. 4D show the results of computations. FIG. 4A shows the transmission characteristic of the multiplexer 23. FIG. 4B shows the isolation characteristic of the multiplexer 23. FIG. 4C is an enlarged graph of a portion in FIG. 4B (portion surrounded by a rectangle). FIG. 4D is a Smith chart showing the impedance of the receiving filter 29 in the reception band. The relationships between the types of lines and the capacities are shown in FIG. 4B. In FIG. 4A to FIG. 4C, the abscissas show the frequencies (MHz), and the ordinates show the characteristics (dB).

As shown in these graphs, even in the case of the smallest capacity set of 0.03 pF, in comparison with the case where the capacity was 0.00 pF, the effect of improvement of isolation was confirmed. As particularly clearly shown in FIG. 4C, the larger the capacity, the greater the isolation. When the capacity became 0.1 pF or more, in comparison with the case where the capacity was 0.00 pF, the effect of 0.5 dB or more was obtained.

Simulation calculations the same as those described above were carried out also in frequency bands different from those described above. Specifically, as the multiplexer 23, one corresponding to the UMTS band 1 (transmission band:

1920 to 1980 MHz, reception band: 2110 to 2170 MHz) was assumed. In the Band 1, between the antenna terminal 25 and the reception terminal 37, a ladder filter, and a DMS filter 1 are connected in order from the antenna terminal side.

FIG. 5A to FIG. 5D are graphs the same as FIG. 4A to FIG. 4D and show the results of computation. Even in the results of computation for this band 1, the same effects as the results of computation for the band 3 were confirmed. That is, the effect of improvement of isolation was confirmed even if the capacity was 0.03 pF, the isolation was improved more as the capacity became larger, and the effect of 0.5 dB or more was obtained if the capacity was 0.1 pF or more. Further, it was confirmed that the effect of improvement of isolation was manifested due to the present structure without depending upon the configuration and frequency band of the DMS filter.

That is, it was confirmed that even if not a two-stage DMS structure like the first DMS filter 1A and second DMS filter 1B, the isolation can be improved by capacity-coupling of the ground electrode at the DMS filter at the rear stage (reception terminal side) and the reception terminal.

Further, it is also confirmed that the isolation can be further raised by separating the ground electrode in the ladder filter at the front stage (antenna terminal side) and the ground electrode in the DMS filter at the rear stage (the reception terminal side).

(Examples: Influence of Conductor Patterns)

A simulation calculation was performed for studying the characteristics of the multiplexers 23 assuming various shapes of comparative examples and examples for the conductor patterns of the receiving filter 29.

FIG. 6A is a view corresponding to FIG. 3A and shows the conductor patterns in a first comparative example. In the first comparative example, the capacity element part 41 is not provided. Further, in the first comparative example, a fifth GND terminal 45E on the right bottom on the drawing sheet is not connected with the second DMS filter 1B. The rest is substantially the same as the example in FIG. 3A.

FIG. 6B is a view corresponding to FIG. 6A and shows the conductor patterns in a first example. The first example is obtained by adding a conductor indicated by black hatching to the first comparative example. This additional portion is a portion of the third GND conductor 51C or fourth GND conductor 51D or a portion configuring one GND conductor 51 together with them. That is, in the first example, in the same way as the example shown in FIG. 3C, the GND conductor 51 which is connected to the IDT electrodes 7 at the two end parts in the second DMS filter 1B extend so as to surround the reception terminal conductor 49 together with the second DMS filter 1B. The capacity of the capacity element part 41 is 0.1 pF.

Figure 6C:
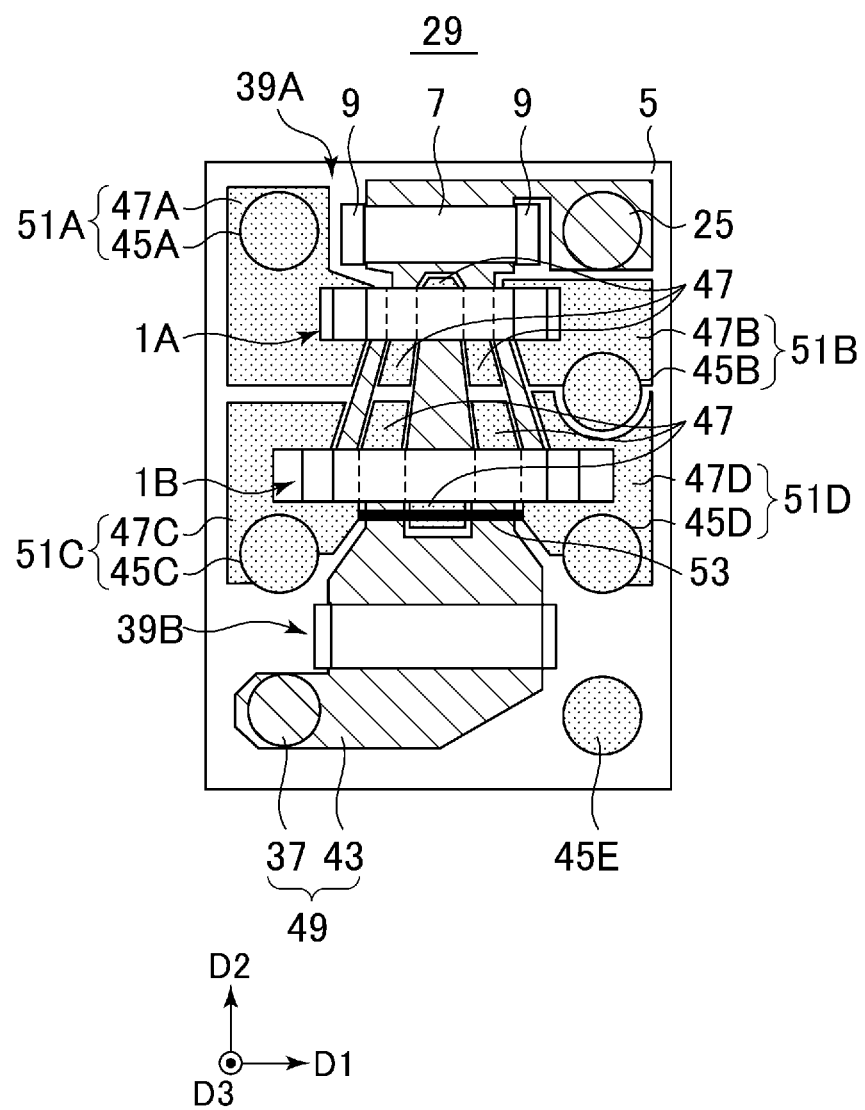
FIG. 6C is a plan view showing the conductor patterns in a second comparative example.

FIG. 6C is a view corresponding to FIG. 6A and shows the conductor patterns in a second comparative example. The second comparative example is obtained by adding a conductor indicated by black hatching to the first comparative example. This additional portion is a wiring connecting the third GND conductor 51C and the fourth GND conductor 51D and three-dimensionally intersects a wiring connecting the second DMS filter 1B and the second auxiliary resonator 39B through an insulation layer.

FIG. 7A to FIG. 7H show the results of simulation calculation. In these computations, as the multiplexers 23, ones corresponding to the UMTS band 3 were assumed.

Figure 7A:
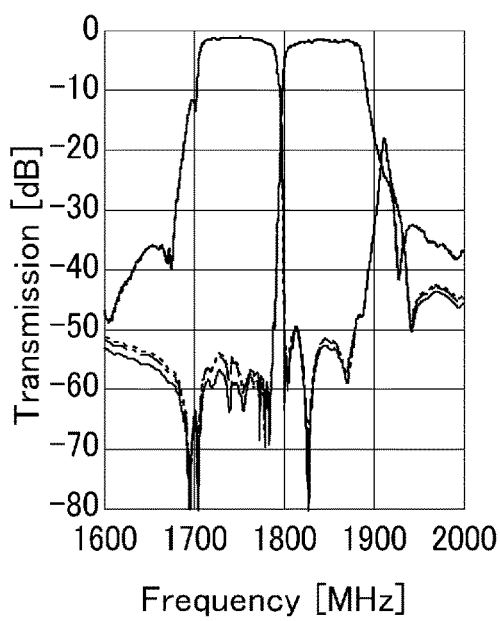
FIG. 7A, FIG. 7B, FIG. 7C, FIG. 7D, FIG. 7E, FIG. 7F, FIG. 7G, and FIG. 7H are graphs showing the results of simulation calculation according to a first comparative example, first example, and second comparative example.
Figure 7B:
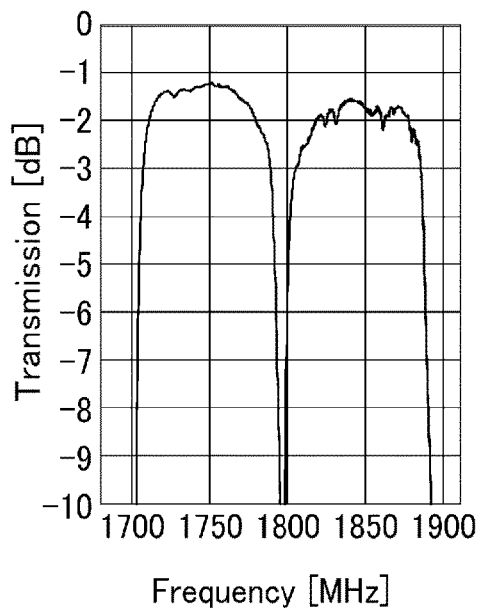
Figure 7C:
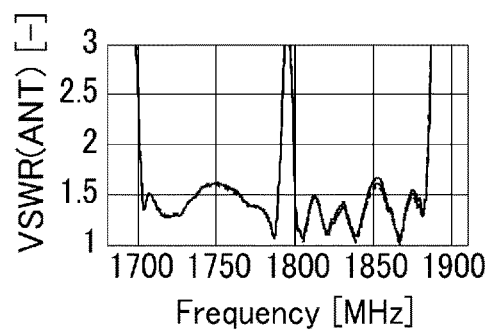
Figure 7D:
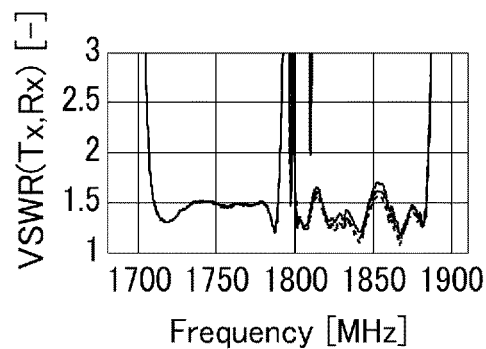
Figure 7E:
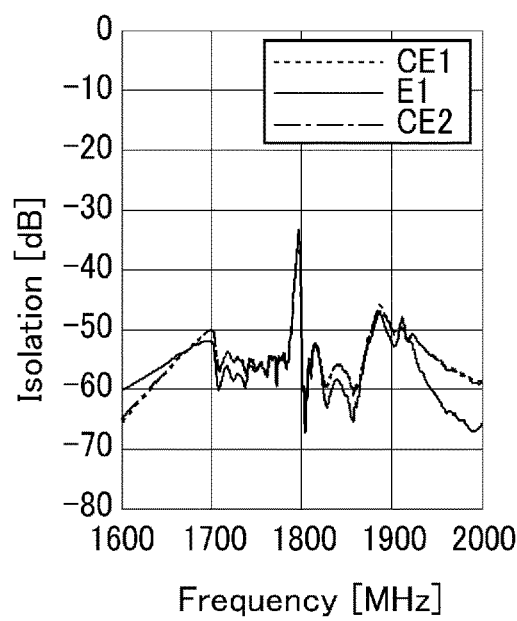
Figure 7F:
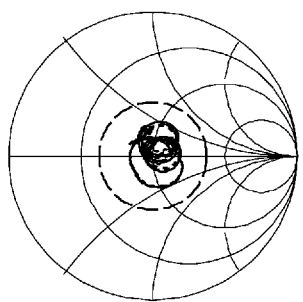

FIG. 7A shows the transmission characteristics of the multiplexer 23. FIG. 7B shows the transmission characteristics of the multiplexer 23 in a broader frequency range and broader pass characteristic range than FIG. 7A. FIG. 7C shows a standing wave ratio in the antenna terminal 25. FIG. 7D shows standing wave ratios in the transmission terminal 31 and reception terminal 37. FIG. 7E shows the isolation characteristics of the multiplexers 23. FIG. 7F shows a Smith chart showing the impedance seen from the antenna terminal 25 within a frequency range from the transmission band to the reception band.

Figure 7G:
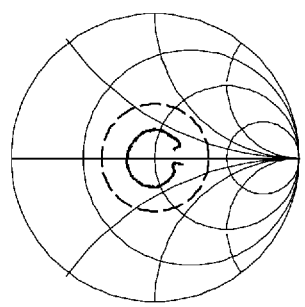
Figure 7H:
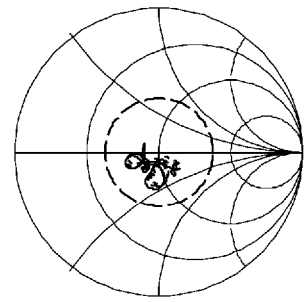
Figure 8A:
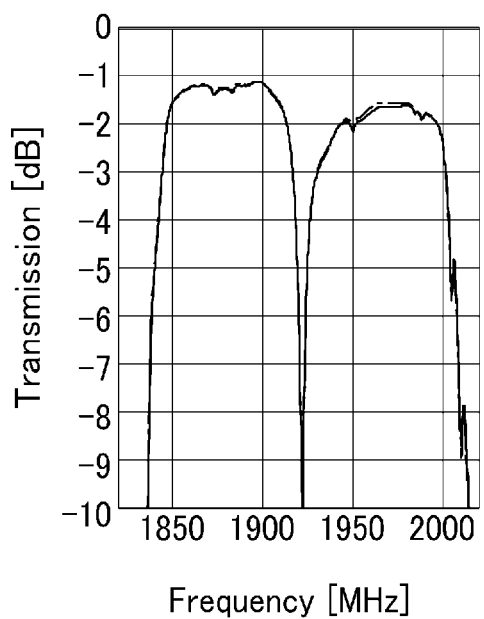
FIG. 8A, FIG. 8B, FIG. 8C, FIG. 8D, FIG. 8E, FIG. 8F, FIG. 8G, and FIG. 8H are graphs showing the results of simulation calculation according to a third comparative example and second example.
Figure 8C:
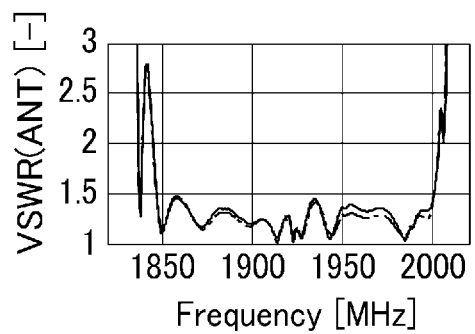
Figure 8D:
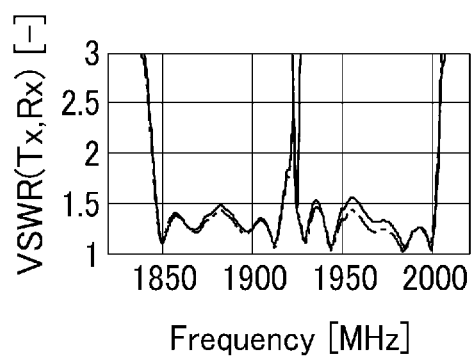
Figure 8B:
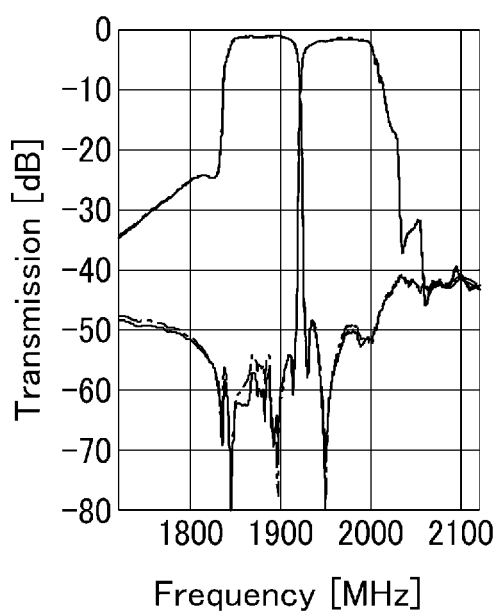
Figure 8E:
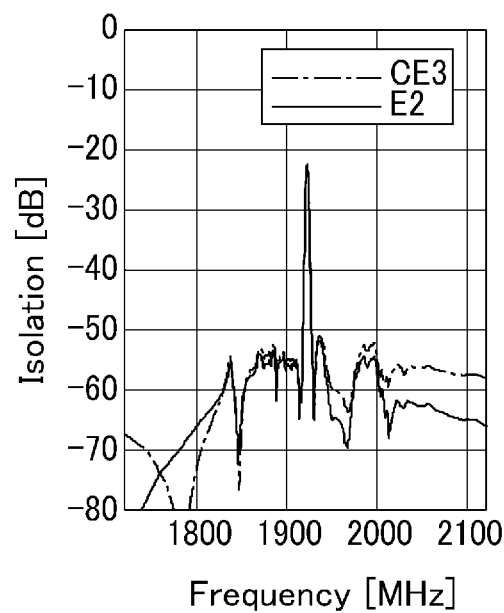
Figure 8F:
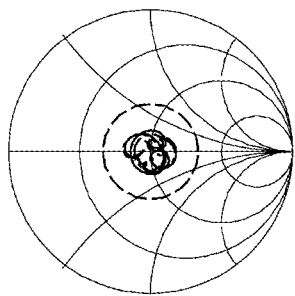
Figure 8G:
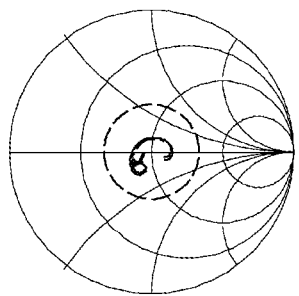
Figure 8H:
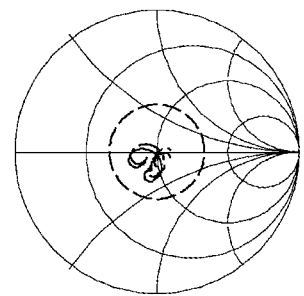

In FIG. 7A to FIG. 7E, the abscissas show the frequencies (MHz), and the ordinates show the characteristics (dB) or standing wave ratios. In FIG. 7F to FIG. 7H, circles indicated by broken lines centered about the centers of the charts show references at which the standing wave ratio should be lower. The assignment of the types of lines are shown in FIG. 7E. The notations assigned to the types of lines are: CE1: first comparative example (FIG. 6A), E1: first example (FIG. 6B), and CE2: second comparative example (FIG. 6C). The line CE1 and the line CE2 overlap in many portions, therefore differentiation of the two becomes difficult.

From a comparison of the first comparative example and the first example, it can be confirmed that the isolation is improved by 1 to 1.5 dB. Further, when comparing the first comparative example and the second comparative example, no significant difference can be found in isolation. It will be understood from this fact that the improvement of the isolation in the first example is not based on the connection of the third GND conductor 51C and the fourth GND conductor 51D, but is based on the arrangement of the third GND conductor 51C and/or fourth GND conductor 51D.

FIG. 8A to FIG. 8H are graphs corresponding to FIG. 7A to FIG. 7H and show the results of simulation calculation in cases assuming filters corresponding to the UMTS band 25 (transmission band: 1850 to 1915 MHz, reception band: 1930 to 1995 MHz) as the multiplexers 23 according to FIG. 6A and FIG. 6B (designated as third comparative example and second example). The notations assigned to the types of lines in the graphs are: CE3: third comparative example and E2: second example.

In the band 25 as well, the same results of computation as the results of computation performed for the band 3 were obtained. That is, by providing the GND conductors 51 (51C and 51D) connected to the IDT electrodes 7 at the two end parts in the second DMS filter 1B so as to surround the reception terminal conductor 49 by these conductors and the second DMS filter 1B together, the isolation was improved by 1 to 1.5 dB. Further, it was confirmed that the effect of improvement of isolation was manifested according to the present structure without depending upon the configuration and frequency band of the DMS filter.

Figure 9A:
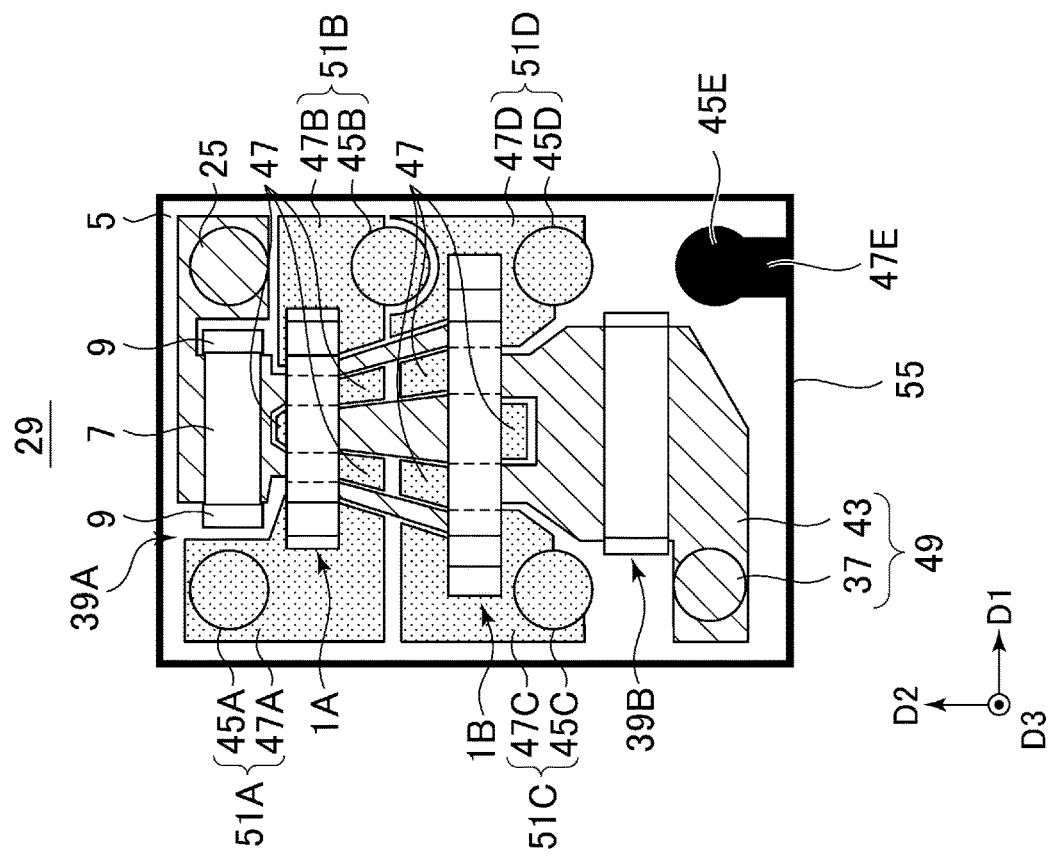
FIG. 9A is a plan view showing the conductor patterns in a fourth comparative example.

FIG. 9A is a view corresponding FIG. 6A and shows the conductor pattern in a fourth comparative example. The fourth comparative example is obtained by adding a conductor shown with black hatching to the first comparative example. This additional portion is a ring-shaped conductor 55 surrounding the antenna terminal 25 and the entire receiving filter 29. The capacity of the portion in which the ring-shaped conductor 55 and the reception terminal conductor 49 are adjacent is 0.1 pF. The ring-shaped conductor 55 is for example not given either a signal or a reference potential and is made an electrically floating state.

Figure 9B:
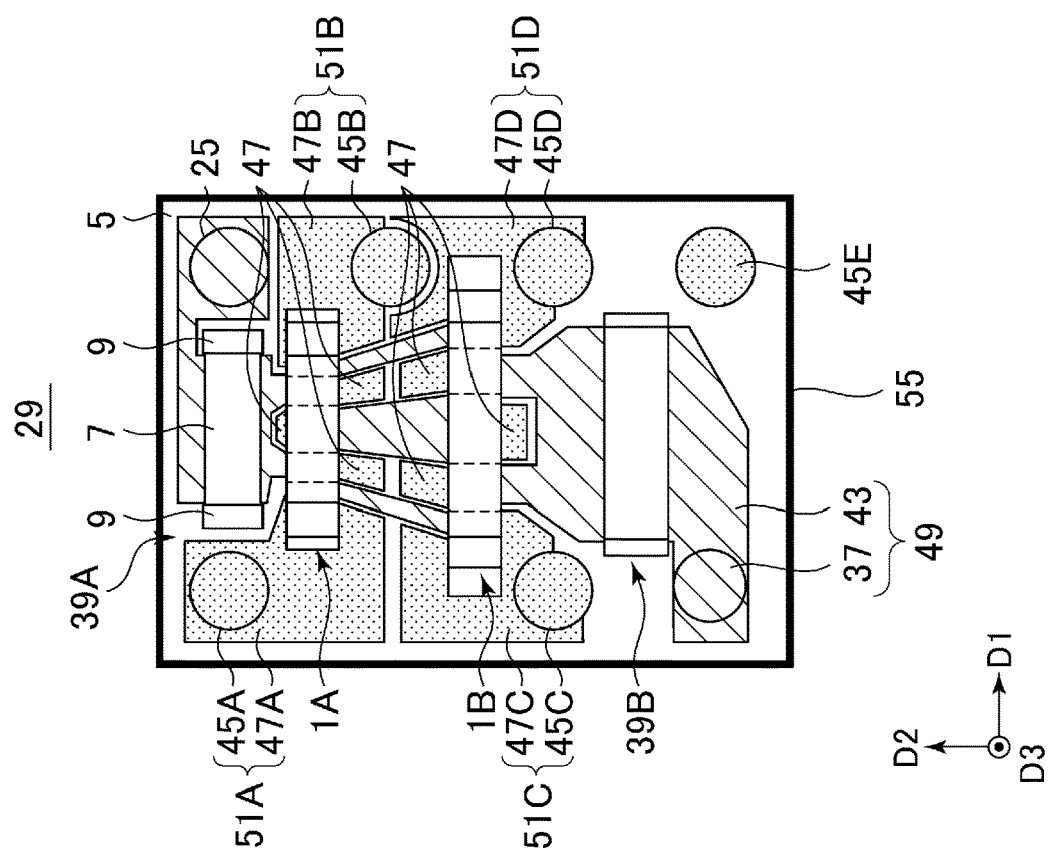
FIG. 9B is a plan view showing the conductor patterns in a fifth comparative example.

FIG. 9B is a view corresponding to FIG. 6A and shows the conductor patterns in a fifth comparative example. The fifth comparative example, as shown by the black hatching, is obtained by connecting the ring-shaped conductor 55 and the fifth GND terminal 45E by the fifth GND wiring 47R in the fourth comparative example.

Figure 9C:
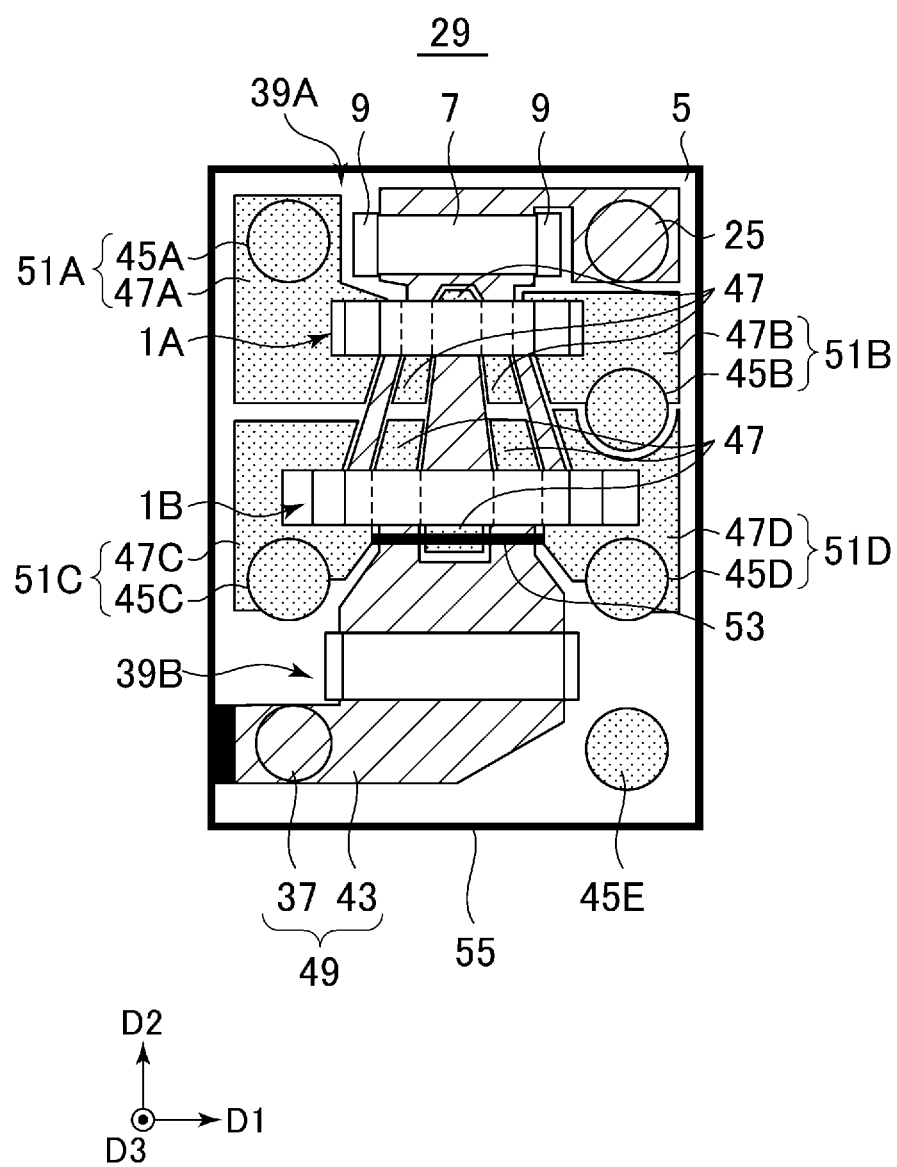
FIG. 9C is a plan view showing the conductor patterns in a sixth comparative example.
Figure 10A:
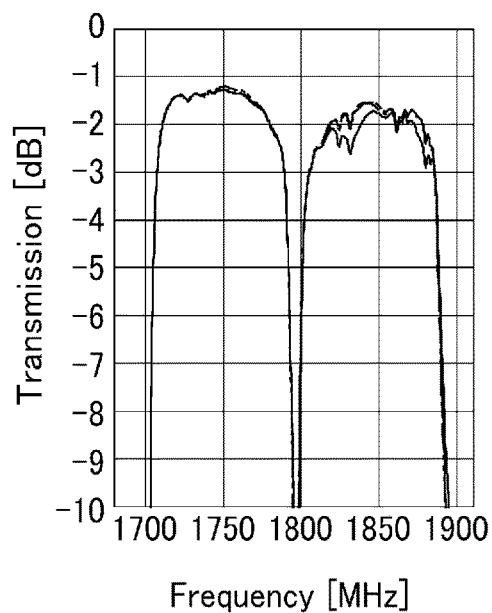
FIG. 10A, FIG. 10B, FIG. 10C, FIG. 10D, FIG. 10E, FIG. 10F, FIG. 10G, and FIG. 10H are graphs showing the results of simulation calculation according to fourth to sixth comparative examples.
Figure 10B:
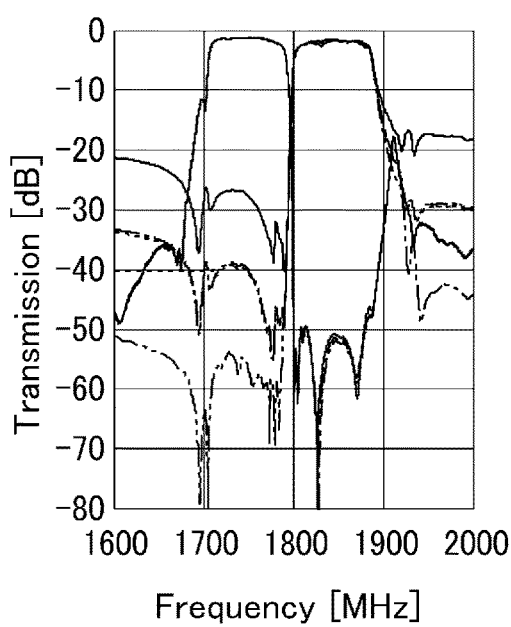
Figure 10C:
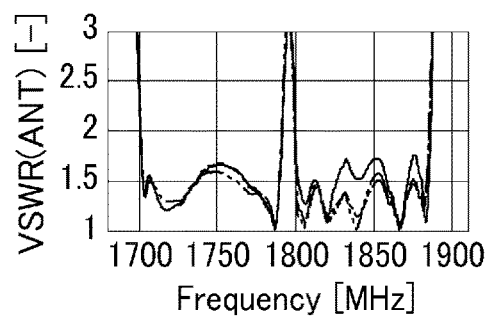
Figure 10D:
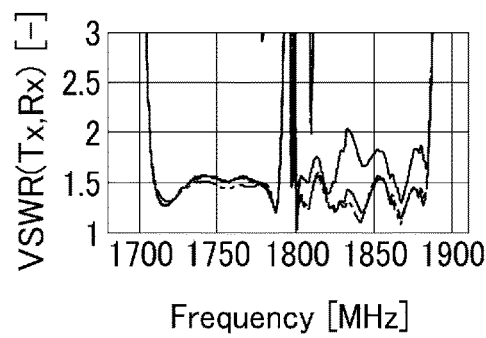
Figure 10E:
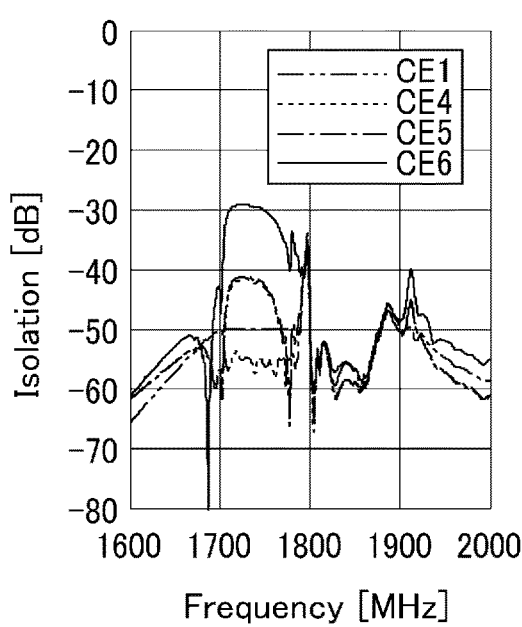
Figure 10F:
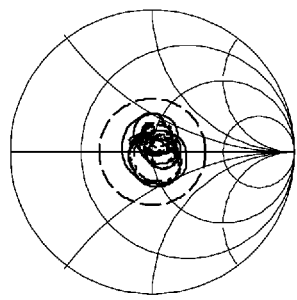
Figure 10G:
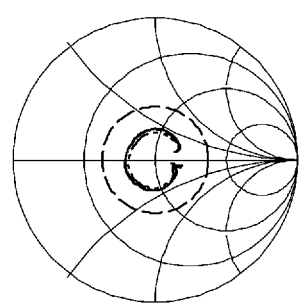
Figure 10H:
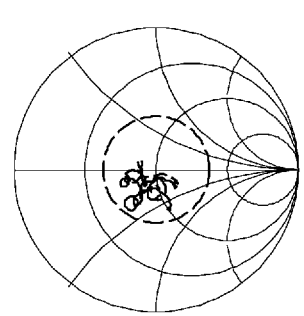

FIG. 9C is a view corresponding FIG. 6A and shows the conductor patterns in a sixth comparative example. The sixth comparative example, as shown by the black hatching, is obtained by connecting the ring-shaped conductor 55 and the reception terminal conductor 49 in the fourth comparative example.

FIG. 10A to FIG. 10H are graphs corresponding to FIG. 7A to FIG. 7H and show the results of simulation calculation for first and fourth to sixth comparative examples. The frequency bands of the multiplexers 23 are the UMTS band 3 in the same way as FIG. 7A to FIG. 7H. The notations assigned to the types of lines in the graphs are: CE1: first comparative example, CE4: fourth comparative example, CE5: fifth comparative example, and CE6: sixth comparative example. The line CE4 and the line CE5 overlap in many portions, therefore differentiation of the two becomes difficult.

It will be understood from these figures that, even if the ring-shaped conductor 55 is provided, if the ring-shaped conductor 55 is not connected to the DMS filter 1, the isolation is not improved, but is rather degraded. This may be caused by an increase of signal leakage from the receiving filter 29 to the transmission filter 27 through the ring-shaped conductor 55.

FIG. 11A is a view corresponding to FIG. 6A showing the conductor patterns in a third example. The third example is obtained by connecting the ring-shaped conductor 55 and the first DMS filter 1A by the first GND wiring 47A in the fourth comparative example. Note that, the ring-shaped conductor 55 may be grasped as a portion of the first GND wiring 47A (first GND conductor 51A).

FIG. 11B is a view corresponding to FIG. 6A showing the conductor patterns in a fourth example. The fourth example is obtained by connecting the ring-shaped conductor 55 and the second DMS filter 1B by the third GND wiring 47C in fourth comparative example. Note that, the ring-shaped conductor 55 may be grasped as a portion of the third GND wiring 47C (third GND conductor 51C).

Figure 11C:
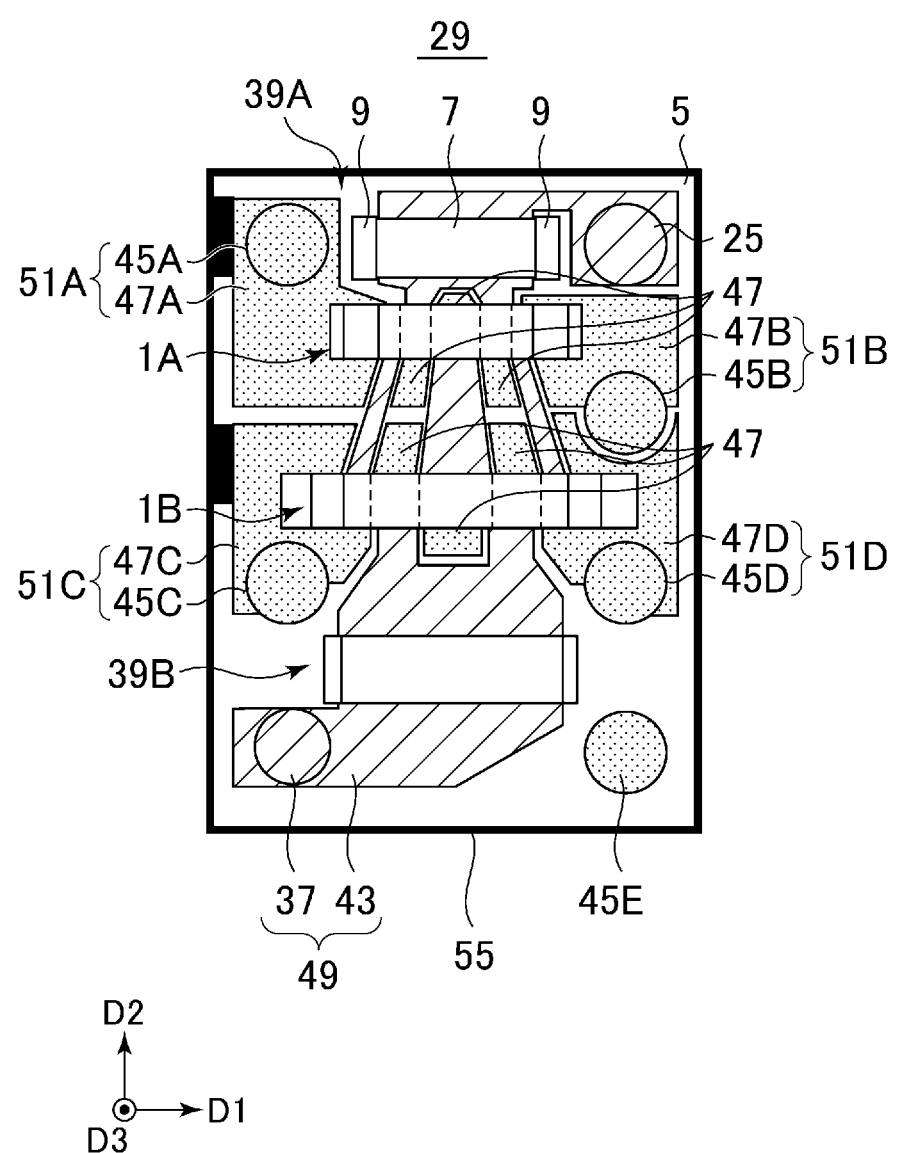
FIG. 11C is a plan view showing the conductor patterns in a fifth example.
Figure 12A:
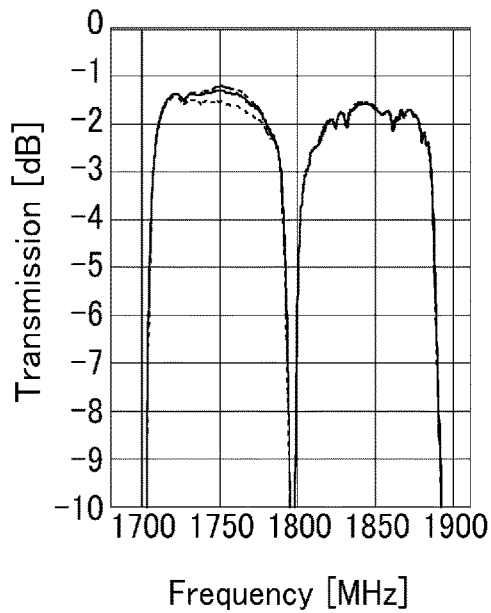
FIG. 12A, FIG. 12B, FIG. 12C, FIG. 12D, FIG. 12E, FIG. 12F, FIG. 12G, and FIG. 12H are graphs showing the results of simulation calculation according to the third to fifth examples.
Figure 12B:
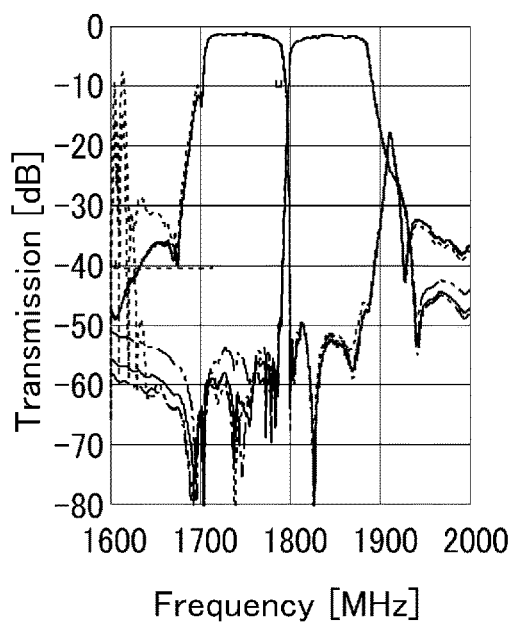
Figure 12C:
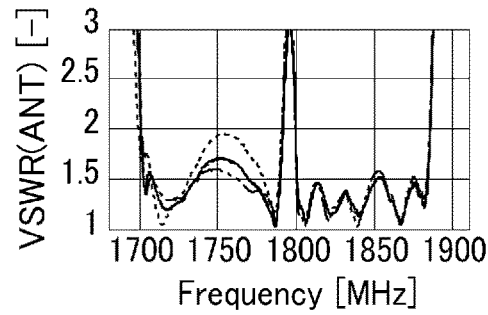
Figure 12D:
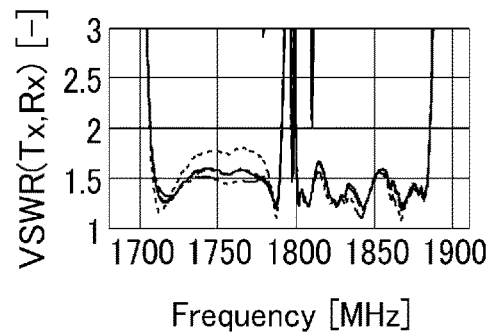
Figure 12E:
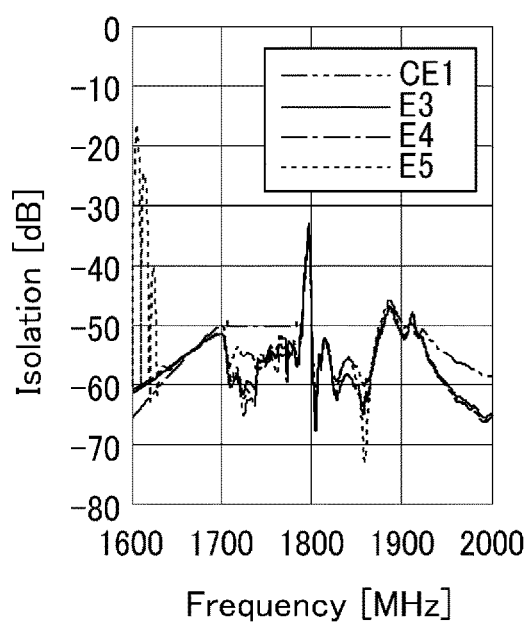
Figure 12F:
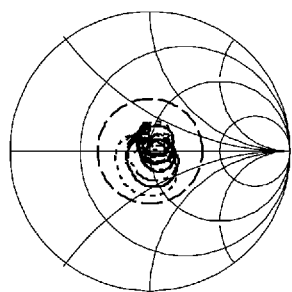
Figure 12G:
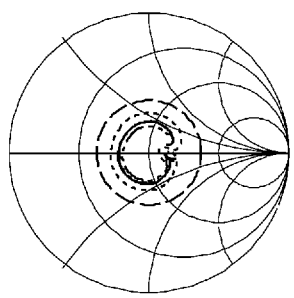
Figure 12H:
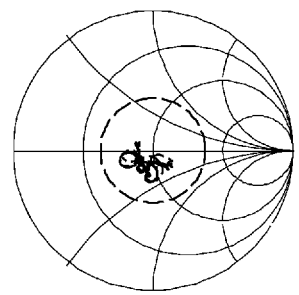

FIG. 11C is a view corresponding to FIG. 6A and shows the conductor patterns in a fifth example. The fifth example is obtained by combining the third example and the fourth example. That is, the fifth example is obtained by connecting the ring-shaped conductor 55 and the first DMS filter 1A by the first GND wiring 47A and connecting the ring-shaped conductor 55 and the second DMS filter 1B by the third GND wiring 47C. Note that, the ring-shaped conductor 55, the first GND conductor 51A, and the third GND conductor 51C as a whole may be grasped as a GND conductor 51.

FIG. 12A to FIG. 12H are graphs corresponding to FIG. 7A to FIG. 7H and show the results of simulation calculation for the first comparative example and third to fifth examples. The frequency bands of the multiplexers 23 are the UMTS band 3 in the same way as FIG. 7A to FIG. 7H. The notations assigned to the types of lines in the graphs are: CE1: first comparative example, E3: third example, E4: fourth example, and E5: fifth example. The line E3 and the line E4 overlap in many portions, therefore differentiation of the two becomes difficult.

It will be understood from these figures that the isolation is improved in cases where the ring-shaped conductor 55 is connected to the DMS filter 1. Overall, the isolation becomes good in a fourth example in which the ring-shaped conductor 55 is connected to the second DMS filter 1B. A third example in which the ring-shaped conductor 55 is connected to the first DMS filter 1A gives a better isolation than the fourth example in part. A fifth example combining the two examples is improved in isolation in the transmission band in comparison with the first comparative example, but is not improved so much in isolation in the reception band.

As described above, in the present disclosure, the receiving filter 29 includes the reception terminal 37 which outputs the reception signals from the antenna terminal 25, the second DMS filter 1B (may be first DMS filter 1A as well) constituted by a longitudinally coupled double-mode type acoustic wave filter which is positioned in the signal path from the antenna terminal 25 to the reception terminal 37, the fourth GND terminal 45D (may be the other GND terminal 45 as well) given the reference potential, and the fourth GND wiring 47D connected to the fourth GND terminal 45D and to the second DMS filter 1B. The reception terminal conductor 49 configured by the reception terminal 37 and the reception terminal wiring 43 connected to the reception terminal 37 and the fourth GND conductor 51D configured by the fourth GND terminal 45D and the fourth GND wiring 47D are adjacent and are capacity-coupled with respect to each other.

Accordingly, as shown by simulation calculation, the isolation between the receiving filter 29 and another filter (for example, the transmission filter 27) is improved. In this configuration, it is sufficient that capacity-coupling can be carried out. For example, it is not always necessary to surround the reception terminal conductor 49 by the GND conductors 51, therefore the degree of freedom of design is high and also reduction of size of the receiving filter 29 is easy. Further, the improvement of isolation by capacity-coupling is not based on the shield effect, therefore this is effective also in a configuration in which a shield has been already provided between the transmission filter 27 and the receiving filter 29. Further, it is effective even in a configuration in which the transmission filter 27 and the receiving filter 29 are provided on different piezoelectric substrates 5.

Further, in the present disclosure, the receiving filter 29 has a plurality of DMS filters 1 which are connected in multiple stages and are positioned in the signal path from the antenna terminal 25 to the reception terminal 37. The fourth GND conductor 51D (may be other GND conductor 51 as well) is connected to only one DMS filter 1.

Accordingly, as understood from the fact that the isolation was better in the third example (FIG. 11A) and fourth example (FIG. 11B) in comparison with fifth example (FIG. 11C), good isolation is obtained. Further, the probability of lowering of amount of attenuation due to mutual coupling of the DMS filters 1 (see the line E5 on the low frequency side in FIG. 12B) is reduced.

Further, in the present disclosure, the DMS filter 1 (second DMS filter 1B) connected with the GND conductor 51 (for example fourth GND conductor 51D) capacity-coupled with the reception terminal conductor 49 is positioned on the side closer to the reception terminal 37 than all other DMS filters 1 (first DMS filter LA) in the signal path from the antenna terminal 25 to the reception terminal 37.

Accordingly, as understood from the fact that the isolation was better in fourth example (FIG. 11B) in comparison with third example (FIG. 11A), good isolation is obtained. Further, "closest to the reception terminal 37 in connection" usually means "closest to the reception terminal 37 also in the arrangement on the piezoelectric substrate 5". Accordingly, for example, the necessity of laying the fourth GND wiring 47D in order to capacity-couple the fourth GND conductor 51D with (make it approach) the reception terminal 37 is reduced.

Further, in the present disclosure, concerning the arrangement on the surface of the piezoelectric substrate 5, the second GND conductor 51B is positioned between the fourth GND conductor 51D and the antenna terminal 25. The second GND conductor 51B and the fourth GND conductor 51D are not connected.

Accordingly, for example, the probability of coupling of the reception terminal 37 and the antenna terminal 25 by the fourth GND conductor 51D capacity-coupled with the reception terminal 37 is reduced. As a result, for example, the probability of degradation of isolation or increase of impedance (increase of insertion loss) in the bandwidth of the transmission filter 27 is reduced.

Note that, the receiving filter 29 according to each of the disclosures explained above may be mounted on a not shown mounting substrate through solder or other bumps. Alternatively, a cover may be provided on the piezoelectric substrate 5 and terminals may be led out on the upper surface of this cover to form a so-called WLP (wafer level package) element, and the WLP element may be mounted on the mounting substrate. When the WLP element is formed, even if a conductor layer having a different potential from that of the terminals is positioned close such as the reception terminal 37 and the GND conductors 51C and 51D shown in FIG. 3C, the two are not short-circuited, therefore they can be stably electrically connected to the mounting substrate.

(Example of Conductor Patterns of Multiplexer)

Figure 13:
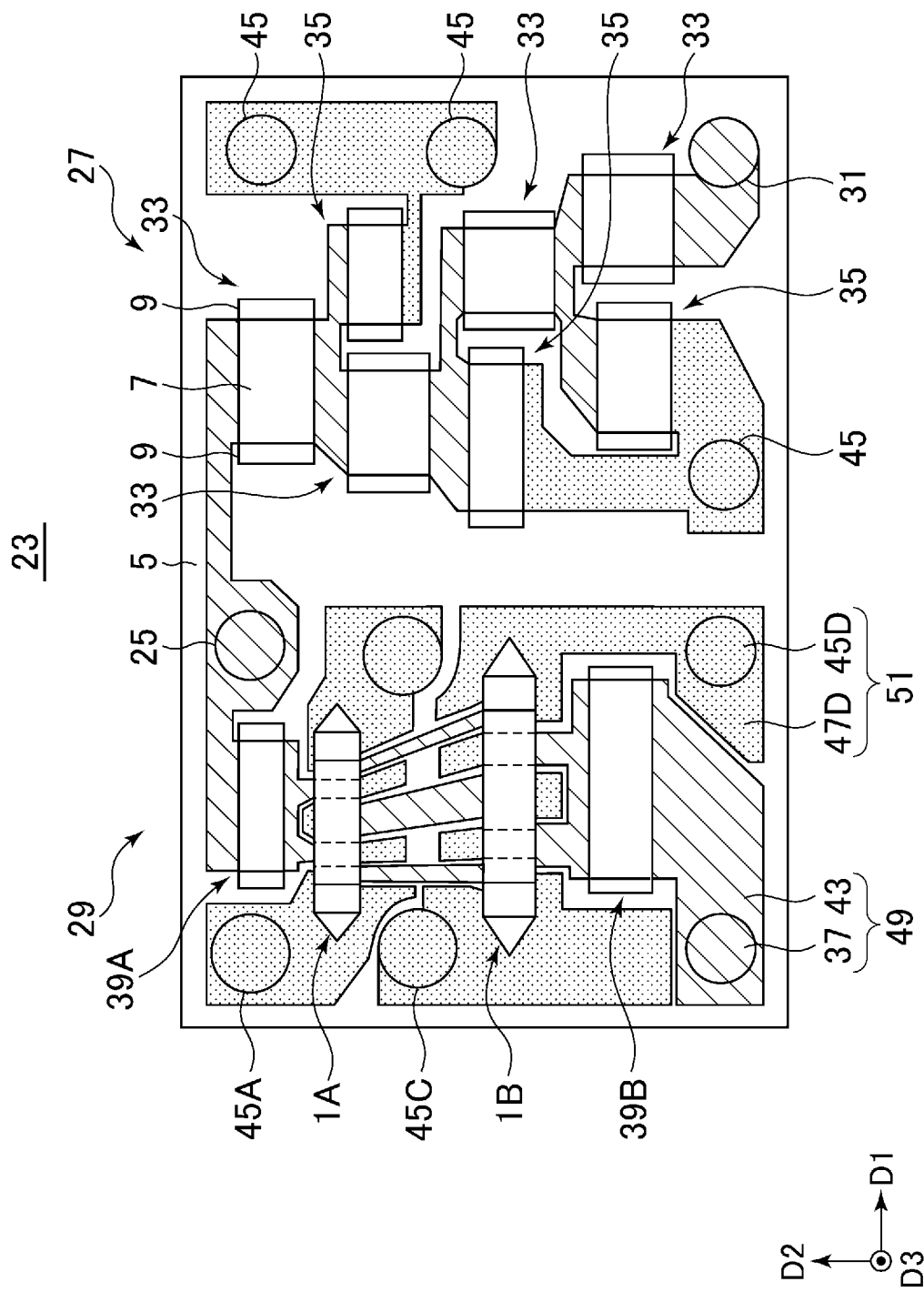
FIG. 13 is a plan view showing an example of the conductor patterns in a multiplexer.

FIG. 13 is a plan view showing an example of the conductor patterns of the multiplexer 23. This view is the same as FIG. 3A etc. except that the example of the conductor patterns of the transmission filter 27 is also shown.

As shown in this example, the antenna terminal 25, transmission filter 27, and receiving filter 29 may be provided on the same surface of the same piezoelectric substrate 5. Further, in this case, the transmission filter 27 and the receiving filter 29 may be adjacent to each other. The shapes of the conductor patterns of the receiving filter 29 may be the already shown shapes or suitable shapes other than the same. Here, use is made of the shapes in the example in FIG. 3B.

In the transmission filter 27, the conductors (regions indicated by oblique hatching) given the signals include for example the transmission terminal 37 (region surrounded by circle). Further, the conductors, as understood also from comparison between FIG. 13 and FIG. 2, include for example wirings (notation omitted) connecting the antenna terminal 25, a plurality of serial resonators 33 and a transmission terminal 31 in series, and wirings (notation omitted) connecting the above wirings and the plurality of parallel resonators 35.

Further, in the transmission filter 27, the conductors (regions indicated by dotted hatchings) given the reference potentials include for example the GND terminals 45 (regions surrounded by circles) and the GND wirings 47 continuing from the GND terminals 45. The GND wirings 47 for example contribute to the connections of the GND terminals 45 and one comb-shaped electrodes 11 in the parallel resonators 35, mutual connection of the GND terminals 45, and the like.

The fourth GND wiring 47D in the receiving filter 29 is positioned between the transmission filter 27 and the receiving filter 29 on the upper surface of the piezoelectric substrate 5. Accordingly, for example, laying the wiring for capacity-coupling with the reception terminal 37 enables it to function as a shield between the transmission filter 27 and the receiving filter 29, therefore the isolation is further improved.

Note that, in this example, the explanation was given by taking as an example the case where the transmission filter 27 and the receiving filter 29 were provided on the same piezoelectric substrate 5, but they may be provided on different substrates as well.

<Communication Apparatus>

Figure 14:
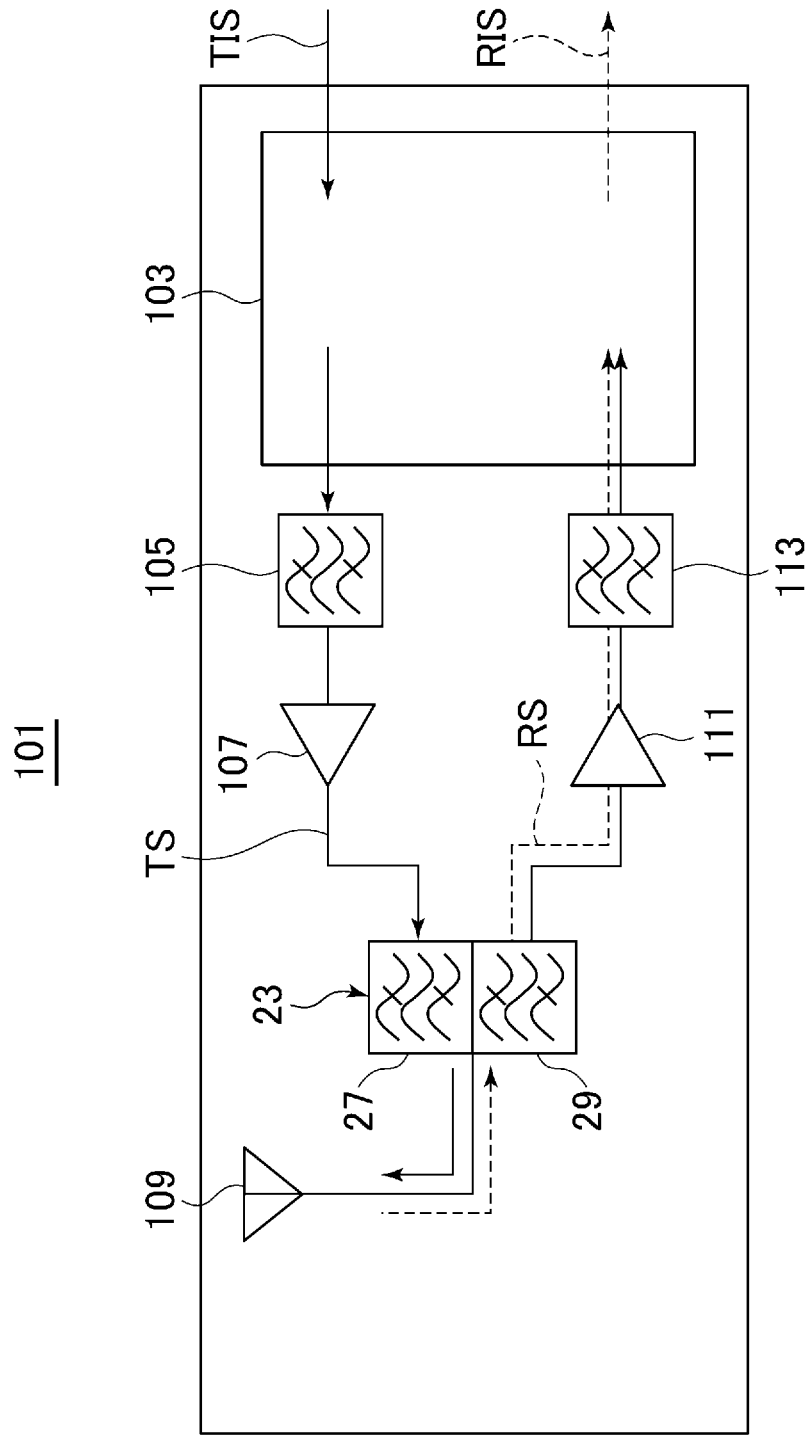
FIG. 14 is a schematic view showing a communication apparatus as an example of use of a multiplexer.

FIG. 14 is a block diagram showing principal parts of a communication apparatus 101 as an example of use of the multiplexer 23. The communication apparatus 101 performs wireless communication utilizing radio waves and includes the multiplexer 23.

In the communication apparatus 101, a transmission information signal TIS including the information to be transmitted is modulated and raised in frequency (conversion to a high frequency signal of a carrier frequency) by the RF-IC (radio frequency integrated circuit) 103 to form a transmission signal TS. The transmission signal TS is stripped of unwanted components out of the transmission-use passing band by a bandpass filter 105, amplified by an amplifier 107, and input to the multiplexer 23 (transmission terminal 31). Further, the multiplexer 23 removes the unwanted components out of the transmission-use passing band from the input transmission signal TS and outputs the transmission signal TS after the removal from the antenna terminal 25 to an antenna 109. The antenna 109 converts the input electrical signal (transmission signal TS) to a wireless signal (radio wave) and transmits the result.

Further, in the communication apparatus 101, the wireless signal (radio wave) received by the antenna 109 is converted to an electrical signal (reception signal RS) by the antenna 109 and is input to the multiplexer 23 (antenna terminal 25). The multiplexer 23 removes the unwanted components out of the reception-use passing band from the input reception signal RS and outputs the result to an amplifier 111. The output reception signal RS is amplified by the amplifier 111 and is stripped of unwanted components out of the reception-use passing band by a bandpass filter 113. Further, the reception signal RS is lowered in frequency and demodulated by the RF-IC 103 to thereby form a reception information signal RIS.

Note that, the transmission information signal TIS and reception information signal RIS may be low frequency signals (baseband signals) including suitable information. For example, they are analog audio signals or digital audio signals. The passing band of the wireless signal may be one based on various standards such as the UMTS. The modulation system may be phase modulation, amplitude modulation, frequency modulation, or any combination combining two or more among them. As the circuit system, a direct conversion system was exemplified in FIG. 14. However, a suitable system other than that may be employed. For example, it may be a double super heterodyne system as well. Further, FIG. 14 schematically shows only the principal parts. A low pass filter or isolator etc. may be added to suitable positions as well. Further, the position of the amplifier or the like may be changed as well.

Note that, in the above disclosure, excluding the third example (FIG. 11A) and fifth example (FIG. 11C), the fourth GND terminal 45D (or third GND terminal 45C) is an example of the first reference potential terminal, the fourth GND wiring 47D (or third GND wiring 47C, it may include the ring-shaped conductor 55 as well) is an example of the first reference potential wiring, the fourth GND conductor 51D (or third GND conductor 51C) is an example of the first reference potential conductor, the second DMS filter 1B is an example of the first filter, the first DMS filter 1A is an example of the second filter, the second GND terminal 45B is an example of the second reference potential terminal, the second GND wiring 47B is an example of the second reference potential wiring, the second GND conductor 51B is an example of the second reference potential conductor, and the RF-IC 103 is an example of the integrated circuit element.

Further, in third example (FIG. 11A), the first GND terminal 45A is an example of the first reference potential terminal, the first GND wiring 47A (ring-shaped conductor 55) is an example of the first reference potential terminal, the first GND conductor 51A is an example of the first reference potential conductor, the first DMS filter 1A is an example of the first filter, and the second DMS filter 1B is an example of the second filter.

In fifth example (FIG. 11C), the first GND terminal 45A or third GND terminal 45C is an example of the first reference potential terminal, the first GND wiring 47A and third GND wiring 47C (ring-shaped conductor 55) are examples of the first reference potential wiring, the first GND conductor 51A and third GND conductor 51C are examples of the first reference potential conductor, and the first DMS filter 1A or second DMS filter 1B is an example of the first filter.

The present disclosure is not limited to the above embodiments and may be executed in various ways.

Mainly configurations in which the reception terminal wiring and the reference potential wiring were adjacent and capacity-coupled with respect to each other was exemplified. However, the combination of the portions which are adjacent and capacity-coupled may be the reception terminal and the reference potential wiring, the reception terminal wiring and the reference potential terminal, the reception terminal and the reference potential terminal, or a combination of them as well.

It is sufficient that the reference potential wiring be directly connected with the reference potential terminal and longitudinally coupled double-mode type filter. It need not continue from the reference potential terminal and/or longitudinally coupled double-mode filter. "Directly connected" means electrical connection without going through an electronic element. An "electronic element" is for example a resistor, capacitor, inductor, resonator, or filter. However, a resistance etc. which is unavoidably generated in a wiring is not included in the electronic element referred to here. Accordingly, for example, a reference potential wiring may be connected to the reference potential terminal and/or filter by a wiring three-dimensionally intersecting the wirings on the piezoelectric substrate through an insulation layer or by a bonding wire. In the same way, it is sufficient that the reception terminal wiring be directly connected to the reception terminal. It need not continue from the reception terminal.

The number of IDTs in the DMS filter is not limited to five. For example, there may be three or seven as well. Further, an unbalanced input-unbalanced output DMS filter was illustrated, but the DMS filter may be a balanced input-balanced output, unbalanced input-balanced output, or balanced input-unbalanced output type as well. Concerning the number or input-output, the configurations may be different among the plurality of DMS filters which are connected in multiple stages.

Note that, the above examples were explained illustrating a duplexer as the multiplexer. However, it may be a diplexer or a multiplexer configured by connecting three or more filters.

REFERENCE SIGNS LIST

1B . . . second DMS filter (first filter (or second filter)), 25 . . . antenna terminal, 29 . . . receiving filter, 37 . . . reception terminal, 43 . . . reception terminal wiring, 45D . . . fourth GND terminal (first reference potential terminal), 47D . . . fourth GND wiring (first reference potential wiring), 49 . . . reception terminal conductor, and 51D . . . fourth GND terminal (first reference potential conductor)

The invention claimed is:

1. A receiving filter comprising
an antenna terminal,
a reception terminal outputting signals from the antenna terminal,
a reception terminal wiring connected to the reception terminal,
a first filter of a longitudinally coupled double-mode type acoustic wave filter located in a signal path from the antenna terminal to the reception terminal,
a first reference potential terminal given a reference potential, and
a first reference potential wiring connected to the first reference potential terminal and to the first filter, wherein
a reception terminal conductor comprising the reception terminal and the reception terminal wiring and a first reference potential conductor comprising the first reference potential terminal and the first reference potential wiring are adjacent and capacitively coupled with respect to each other, further comprising
a piezoelectric substrate in which the antenna terminal, the reception terminal conductor, the first reference potential conductor, and the first filter are located on one surface, and
in a plan view of the surface, the first reference potential conductor extending so as to surround the reception terminal conductor together with the first filter.

2. The receiving filter according to claim 1, further comprising at least one second filter as a longitudinally coupled double-mode type acoustic wave filter which is connected in multi-stages with the first filter and is located in the signal path,
the first reference potential conductor being connected to only the first filter among the first filter and all of the second filters.

3. The receiving filter according to claim 2, wherein the first filter is located on the side closer to the reception terminal than all of the second filters in the signal path.

4. The receiving filter according to claim 1, further comprising
a second reference potential terminal which is located on the surface and is given the reference potential, and
a second reference potential wiring which is connected to the second reference potential terminal on the surface, wherein
in a plan view of the surface, the second reference potential conductor comprising the second reference potential terminal and the second reference potential wiring is located between the first reference potential conductor and the antenna terminal, and
the first reference potential conductor and the second reference potential conductor not being connected.

5. A multiplexer comprising
a receiving filter according to claim 1, and a transmission filter filtering signals to the antenna terminal.

6. The multiplexer according to claim 5, wherein the passband of the receiving filter is higher than the passband of the transmission filter.

7. The multiplexer according to claim 5, wherein:
the transmission filter and the receiving filter are adjacent on a same surface of the piezoelectric substrate, and
the first reference potential conductor is located between the transmission filter and the receiving filter on the surface.

8. A communication apparatus comprising
an antenna,
a multiplexer comprising a receiving filter according to claim 1 and a transmission filter filtering signals to the antenna terminal,
in which the antenna terminal is connected to the antenna, and
an integrated circuit element connected to the transmission filter and to the receiving filter.

9. A receiving filter comprising
an antenna terminal,
a reception terminal outputting signals from the antenna terminal,
a reception terminal wiring connected to the reception terminal,
a first filter of a longitudinally coupled double-mode type acoustic wave filter located in a signal path from the antenna terminal to the reception terminal,
a first reference potential terminal given a reference potential, and
a first reference potential wiring connected to the first reference potential terminal and to the first filter, wherein
a reception terminal conductor comprising the reception terminal and the reception terminal wiring and a first reference potential conductor comprising the first reference potential terminal and the first reference potential wiring are adjacent and capacitively coupled with respect to each other, and
wherein a distance between the reception terminal conductor and the first reference potential conductor is 20 μm or less.

10. A multiplexer comprising
a receiving filter according to claim 9, and a transmission filter filtering signals to the antenna terminal.

11. The multiplexer according to claim 10, wherein the passband of the receiving filter is higher than the passband of the transmission filter.

12. The multiplexer according to claim 10, wherein:
the transmission filter and the receiving filter are adjacent on a same surface of the piezoelectric substrate, and
the first reference potential conductor is located between the transmission filter and the receiving filter on the surface.

13. The receiving filter according to claim 9, further comprising at least one second filter as a longitudinally coupled double-mode type acoustic wave filter which is connected in multi-stages with the first filter and is located in the signal path,
the first reference potential conductor being connected to only the first filter among the first filter and all of the second filters.

14. The receiving filter according to claim 13, wherein the first filter is located on the side closer to the reception terminal than all of the second filters in the signal path.

15. The receiving filter according to claim 9, further comprising
a piezoelectric substrate in which the antenna terminal, the reception terminal conductor, the first reference potential conductor, and the first filter are located on one surface,
a second reference potential terminal which is located on the surface and is given the reference potential, and
a second reference potential wiring which is connected to the second reference potential terminal on the surface, wherein
in a plan view of the surface, the second reference potential conductor comprising the second reference potential terminal and the second reference potential wiring is located between the first reference potential conductor and the antenna terminal, and
the first reference potential conductor and the second reference potential conductor not being connected.

16. A communication apparatus comprising
an antenna,
a multiplexer comprising, a receiving filter according to claim 9, and a transmission filter filtering signals to the antenna terminal
in which the antenna terminal is connected to the antenna, and
an integrated circuit element connected to the transmission filter and to the receiving filter.

17. A receiving filter comprising
an antenna terminal,
a reception terminal outputting signals from the antenna terminal,
a reception terminal wiring connected to the reception terminal,
a first filter of a longitudinally coupled double-mode type acoustic wave filter located in a signal path from the antenna terminal to the reception terminal,
a resonator between the first filter and the reception terminal,
a first reference potential terminal given a reference potential, and
a first reference potential wiring connected to the first reference potential terminal and to the first filter, wherein
a reception terminal conductor comprising the reception terminal and the reception terminal wiring and a first reference potential conductor comprising the first reference potential terminal and the first reference potential wiring are adjacent and capacitively coupled with respect to each other.

18. A multiplexer comprising
a receiving filter according to claim 17, and a transmission filter filtering signals to the antenna terminal.

19. The multiplexer according to claim 18, wherein the passband of the receiving filter is higher than the passband of the transmission filter.

20. The multiplexer according to claim 18, wherein:
the transmission filter and the receiving filter are adjacent on a same surface of the piezoelectric substrate, and
the first reference potential conductor is located between the transmission filter and the receiving filter on the surface.

21. The receiving filter according to claim 17, further comprising at least one second filter as a longitudinally coupled double-mode type acoustic wave filter which is connected in multi-stages with the first filter and is located in the signal path,
the first reference potential conductor being connected to only the first filter among the first filter and all of the second filters.

22. The receiving filter according to claim 21, wherein the first filter is located on the side closer to the reception terminal than all of the second filters in the signal path.

23. The receiving filter according to claim 17, further comprising
- a piezoelectric substrate in which the antenna terminal, the reception terminal conductor, the first reference potential conductor, and the first filter are located on one surface,
- a second reference potential terminal which is located on the surface and is given the reference potential, and
- a second reference potential wiring which is connected to the second reference potential terminal on the surface, wherein
- in a plan view of the surface, the second reference potential conductor comprising the second reference potential terminal and the second reference potential wiring is located between the first reference potential conductor and the antenna terminal, and
- the first reference potential conductor and the second reference potential conductor not being connected.

24. A communication apparatus comprising
- an antenna,
- a multiplexer comprising a receiving filter according to claim 17, and a transmission filter filtering signals to the antenna terminal,
- in which the antenna terminal is connected to the antenna, and
- an integrated circuit element connected to the transmission filter and to the receiving filter.

* * * * *